(12) United States Patent  
Daigle et al.

(10) Patent No.: US 8,762,586 B2
(45) Date of Patent: Jun. 24, 2014

(54) APPARATUS FOR MIXED SIGNAL INTERFACE ACQUISITION CIRCUITRY AND ASSOCIATED METHODS

(71) Applicant: Silicon Laboratories Inc., Austin, TX (US)

(72) Inventors: Clayton Daigle, Austin, TX (US); Jinwen Xiao, Austin, TX (US); Axel Thomsen, Austin, TX (US); Subrata Roy, Austin, TX (US); Xiaodong Wang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/799,159

(22) Filed: Mar. 13, 2013

(65) Prior Publication Data

US 2014/0002133 A1  Jan. 2, 2014

Related U.S. Application Data

(63) Continuation-in-part of application No. 13/731,080, filed on Dec. 30, 2012.

(60) Provisional application No. 61/666,837, filed on Jun. 30, 2012.

(51) Int. Cl.
*G06F 3/00* (2006.01)
*G06F 13/00* (2006.01)

(52) U.S. Cl.
USPC .................. 710/8; 710/100; 326/47; 326/80

(58) Field of Classification Search
CPC .................. H01L 2724/00; G06F 15/7842
USPC .................. 710/8, 100; 716/100; 327/564
See application file for complete search history.

(56) References Cited

U.S. PATENT DOCUMENTS

| | | | | |
|---|---|---|---|---|
| 5,068,603 A | * | 11/1991 | Mahoney | 714/726 |
| 5,818,100 A | * | 10/1998 | Grider et al. | 257/616 |
| 5,825,712 A | * | 10/1998 | Higashi et al. | 365/230.03 |
| 6,522,511 B1 | * | 2/2003 | John et al. | 361/56 |
| 6,562,995 B1 | * | 5/2003 | Lan-Hargest et al. | 560/104 |
| 6,798,069 B1 | * | 9/2004 | Ali et al. | 257/775 |
| 7,113,417 B2 | * | 9/2006 | Pochmuller | 365/51 |

(Continued)

*Primary Examiner* — Christopher Shin
(74) *Attorney, Agent, or Firm* — Law Offices of Maximilian R. Peterson

(57) ABSTRACT

An integrated circuit (IC) includes a plurality of pads adapted to communicate signals with a circuit external to the IC, and a first mixed signal interface block coupled to a first pad in the plurality of pads, where the first mixed signal interface block is adapted to receive a first trigger signal from the circuit external to the IC and to provide a second trigger signal. The IC further includes a second mixed signal interface block coupled to a second pad in the plurality of pads, where the second mixed signal interface block is adapted to receive and track a first input signal from the circuit external to the IC in a first mode of operation of the IC. The second mixed signal interface block is further adapted to generate, in response to the second trigger signal, a first output signal based on the first input signal and to provide the first output signal to a digital core of the IC in a second mode of operation of the IC, where the power consumption of the IC is lower in the first mode of operation than in the second mode of operation.

20 Claims, 20 Drawing Sheets

(56) References Cited

U.S. PATENT DOCUMENTS

| | | | |
|---|---|---|---|
| 2004/0162697 A1* | 8/2004 | Smith et al. | 702/132 |
| 2007/0001240 A1* | 1/2007 | Mallikarjunaswamy et al. | 257/409 |
| 2007/0176632 A1* | 8/2007 | McNamara | 326/47 |
| 2008/0272803 A1* | 11/2008 | Balasubramanian et al. | 326/38 |
| 2009/0251160 A1* | 10/2009 | Miyazaki | 324/754 |
| 2010/0134183 A1* | 6/2010 | Miyazaki et al. | 327/551 |
| 2011/0175760 A1* | 7/2011 | Chen et al. | 341/120 |
| 2012/0161808 A1* | 6/2012 | Elias | 324/762.03 |
| 2013/0043939 A1* | 2/2013 | Kothari et al. | 327/564 |

* cited by examiner

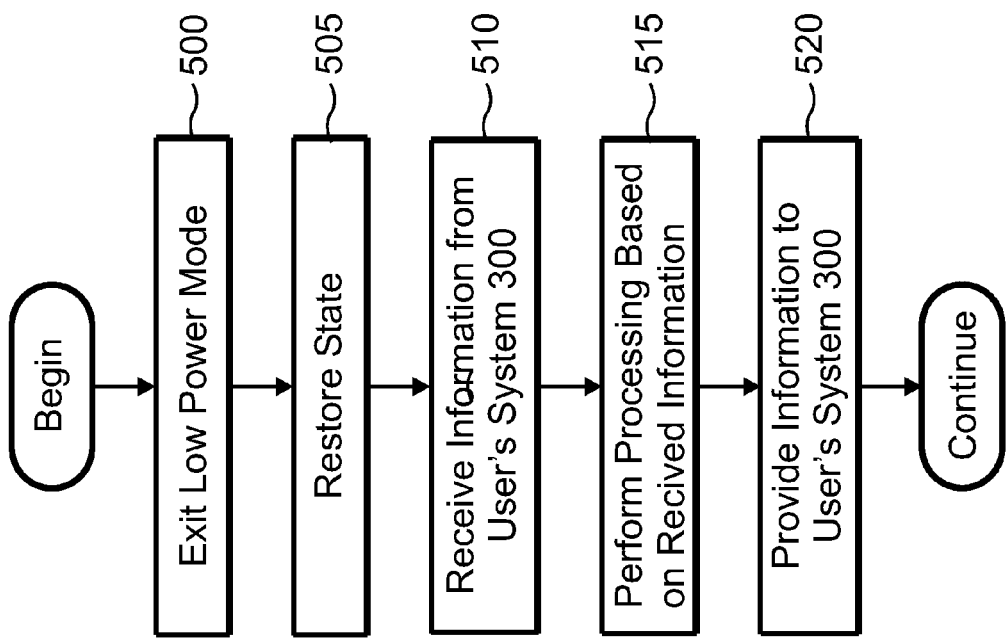

APPARATUS FOR MIXED SIGNAL INTERFACE ACQUISITION CIRCUITRY AND ASSOCIATED METHODS

CROSS-REFERENCE TO RELATED APPLICATIONS

This application is a continuation-in-part (CIP) of U.S. patent application Ser. No. 13/731,080, filed on Dec. 30, 2012, titled "APPARATUS FOR MIXED SIGNAL INTERFACE CIRCUITRY AND ASSOCIATED METHODS," which claims priority to U.S. Provisional Patent Application No. 61/666,837, filed on Jun. 30, 2012, titled "APPARATUS FOR MIXED SIGNAL INTERFACE CIRCUITRY AND ASSOCIATED METHODS,". The foregoing applications are incorporates by reference herein in their entireties for all purposes.

TECHNICAL FIELD

The disclosed concepts relate generally to electronic circuitry and, more particularly, to apparatus for signal acquisition in interface circuitry or blocks in mixed signal integrated circuits (ICs), and associated methods.

BACKGROUND

Modern ICs have helped to integrated electronic circuitry to decrease size and cost. As a consequence, modern ICs can form complex circuitry and systems. For example, virtually all of the functionality of a system may be realized using one or a handful of ICs.

The result has been a growing trend to produce circuitry and systems with increased reliability, flexibility, and functionality. Such circuitry and systems may receive and operate on both analog and digital signals, and may provide analog and digital signals. Consequently, such circuitry and systems may include both analog and digital circuits that interface to one another.

SUMMARY

An IC according to one exemplary embodiment includes a plurality of pads adapted to communicate signals with a circuit external to the IC, and a first mixed signal interface block coupled to a first pad in the plurality of pads, where the first mixed signal interface block is adapted to receive a first trigger signal from the circuit external to the IC and to provide a second trigger signal. The IC further includes a second mixed signal interface block coupled to a second pad in the plurality of pads, where the second mixed signal interface block is adapted to receive and track a first input signal from the circuit external to the IC in a first mode of operation of the IC. The second mixed signal interface block is further adapted to generate, in response to the second trigger signal, a first output signal based on the first input signal and to provide the first output signal to a digital core of the IC in a second mode of operation of the IC, where the power consumption of the IC is lower in the first mode of operation than in the second mode of operation.

According to another exemplary embodiment, a mixed signal IC includes a digital core comprising microcontroller (MCU) circuitry, and a plurality of pads adapted to communicate signals with a circuit external to the IC. The mixed signal IC also includes a first mixed signal interface block coupled to a first pad in the plurality of pads, and adapted to receive a first trigger signal from the circuit external to the IC, and to provide a second trigger signal. The mixed signal IC further includes a trigger circuit. The trigger circuit is adapted to, in response to the second trigger signal, generate a third trigger signal and to generate an interrupt signal and provide the interrupt trigger signal to the digital core of the IC. The mixed signal IC also includes a trigger circuit that is adapted to, in response to the second trigger signal, generate a third trigger signal and to generate an interrupt signal and provide the interrupt trigger signal to the digital core of the mixed signal IC. The mixed signal IC also includes a second mixed signal interface block coupled to a second pad in the plurality of pads, where the second mixed signal interface block is adapted to receive and track a first analog signal from the circuit external to the mixed signal IC in a first mode of operation of the mixed signal IC. The second mixed signal interface block is also adapted to, in response to the third trigger signal, convert the first analog signal to a first digital signal and to provide the first digital signal to the digital core of the mixed signal IC in a second mode of operation of the mixed signal IC.

According to yet another exemplary embodiment, a method of processing signals using a mixed signal IC includes operating the mixed signal IC in a first mode of operation, tracking in a first mixed signal interface block, coupled to a first pad of the mixed signal IC, a first input signal from the circuitry external to the mixed signal IC in the first mode of operation, and using a second mixed signal interface block coupled to a second pad of the mixed signal IC to receive a first trigger signal from the circuitry external to the mixed signal IC and to generate a second trigger signal. The method also includes operating the mixed signal IC in a second mode of operation in response to the second trigger signal, where the power consumption of the mixed signal IC is lower in the first mode of operation than in the second mode of operation. The method further includes converting, in the second mode of operation, the first input signal to a digital signal by performing analog-to-digital conversion in the first mixed signal interface block.

BRIEF DESCRIPTION OF THE DRAWINGS

The appended drawings illustrate only exemplary embodiments and therefore should not be considered as limiting its scope. Persons of ordinary skill in the art appreciate that the disclosed concepts lend themselves to other equally effective embodiments. In the drawings, the same numeral designators used in more than one drawing denote the same, similar, or equivalent functionality, components, or blocks.

FIGS. 19-20 show a flow diagram for low power mode operation of an IC configured for asynchronous information acquisition according to an exemplary embodiment.

DETAILED DESCRIPTION

Figure 1:
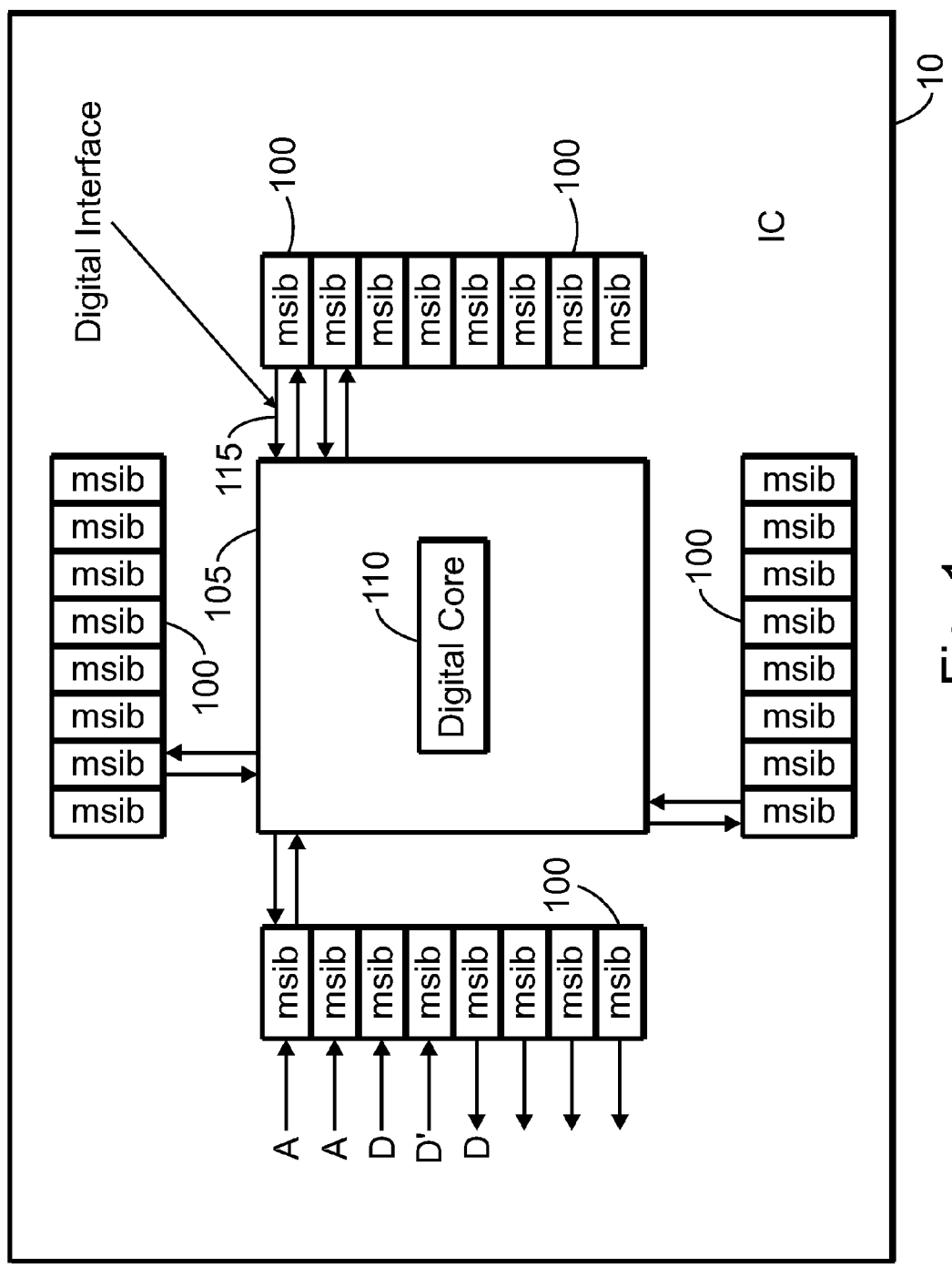
FIG. 1 illustrates a block diagram of an IC that includes a plurality of mixed signal interface blocks (MSIBs) according to an exemplary embodiment.

The disclosed concepts relate generally to providing interface circuitry in ICs. More specifically, the disclosed concepts provide apparatus and methods for mixed signal interfaces in ICs.

In illustrative embodiments, the mixed signal interfaces may be realized as mixed signal interface blocks (MSIB) or circuitry. In some embodiments, one or more MSIBs may be associated with or coupled to or configured or adapted to operate with a corresponding pad of the IC. In some embodiments, some MSIBs may be dedicated to corresponding pads of the IC (i.e., each such MSIB being coupled to or configured or adapted to operate with a corresponding pad).

MSIBs provide a variety of advantages. By using the MSIBs, flexible interface circuitry for communication or interfacing within the IC and/or with circuitry outside or external to the IC may be realized. By using the MSIBs, system on a chip (SOC) designs may be carried out without the designers have to accommodate analog interfaces or to concern themselves with resource sharing (e.g., by including a relatively large number of MSIBs, for instance, having a one-to-one correspondence between the number of the MSIBs and the corresponding pads of the IC).

From a chip assembly perspective, using MSIBs simplifies chip assembly because analog interfaces are typically local, and top level interfaces are digital and therefore suitable to automation. (The reference voltage, which typically remains an analog global signal, and the power supply grid are two exceptions.)

From a product portfolio perspective, the availability of MSIBs, which can be configured in a variety of modes, allows for a single product to cover a wide range of applications. The functions comprised in MSIBs (ADC, DAC, comparator, in various modes, plus digital input and digital output functionality, can be assigned arbitrarily.

Furthermore, application that make relatively heavy or extensive use of ADCs, sensor interfaces (temperature, pressure, etc.), may be served with the same IC including MSIBs as one that makes relatively heavy or extensive use of DACs, such as biasing an optical module, for example. This same IC, using MSIBs, could be configured to detect and produce digital signals with unusual or atypical logic thresholds in comparator mode. Some applications entail or specify a mix of all the above functions that is unique to each system. Without limitation, examples include biasing of sensors with a DAC, reading sensors with an ADC, controlling an analog input with a potentiometer, monitoring temperature for safety, sensing impedance levels on a line through DACs, and ADCs, and so on.

Such systems are sometimes controlled by software and/or firmware. If hardware resources are limited and shared, the scheduling of various tasks, such as those described above, may have to be considered, and may pose limitations. For example, worst case scheduling may have to be determined, and relatively complex software has to be written and maintained to meet the bandwidth specifications for each measurement, yet provide for measurements with relatively high priority to performed and analyzed fast enough (for example safety related tasks). If the system expands in complexity, the architecture, operations, and specifications would have to be re-analyzed and probably rescheduled.

The relative abundance of independent, simultaneously operating, and dedicated resources for IC pads provided by MSIBs simplifies this task. Each measurement can be independently and/or simultaneously scheduled without regard to what other measurements are taking place on the chip at the same time (e.g., other measurements made by MSIBs for other IC pads). The non-time critical signal such as a battery monitor does not need to find an unused timeslot between events of higher priority, and the time critical events (e.g., over-current protection) would not be delayed because of a scheduling of a less critical measurement.

Consequently, all the desired data become available in memory at the expected time, and a controller, host, or other circuit can take actions based on the available data. A more complex system that covers more tasks will not have to reconsider when and how each individual measurement is done. Existing routines can simply be integrated at the top level. The impact of the availability of a relative abundance of configurable MSIB resources at each pin on the simplicity of the software development would constitute an additional advantage.

FIG. 1 illustrates a block diagram of an IC 10 that includes a plurality of MSIBs 100 according to an exemplary embodiment. The MSIBs 100 couple to and communicate with core circuitry 105 of the IC.

The core circuitry 105 of the IC 10 may constitute a digital core 110. The MSIBs 100 may couple to and/or interface with pads (not shown, and in some embodiments may be included with MSIBs 100) of the IC 10. As noted above, some MSIBs may be dedicated to corresponding pads of the IC (i.e., each such MSIB being coupled to or configured or adapted to operate with a corresponding pad). In such arrangements, the dedicated MSIBs may be configured, used, reused, etc., independently of, and/or simultaneously with, other pads (whether dedicated or not).

In some embodiments, the pads coupled to corresponding the MSIBs 100 may be a subset of all pads of the IC 10. In other words, in such embodiments, some pads may have corresponding dedicated MSIBs 100, while some pads may not.

In some embodiments, the pads of the IC 10 may couple to pins of the IC package. In some embodiments, the pads may couple to other circuitry, for example, via bonding wires, as might be the case for multi chip modules (MCMs).

In exemplary embodiments, the digital core 105 of the IC 10 may include a variety of digital circuits or blocks, as persons of ordinary skill in the art understand. Examples include one or more controllers, microcontrollers, processors, microprocessors, field-programmable gate arrays (FPGAs), programmable controllers, and the like. Other examples include memory (e.g., random access memory, read only memory, flash memory (or non-volatile memory generally), one-time programmable (OTP) circuitry), and the like.

Other examples of circuitry in the core (digital core or other core circuitry) of the IC 10 include counters, timers, controllers, clock and timing circuitry (including distribution circuitry), arithmetic circuitry (e.g., adders, subtracters, multipliers, dividers), general and programmable logic circuitry, gates, registers, flip-flops, multiplexers (MUXs), demultiplexers (DeMUXs), and the like. The examples provided above serve merely as illustrative embodiments. As persons of ordinary skill in the art understand, many embodiments are possible that include one or more of the above circuitry, type of circuitry, and/or other circuitry.

The MSIBs 100 provide a flexible mechanism for interfacing between the core circuitry 105 (and/or digital core 110) of the IC 10 and circuitry coupled to the pads and/or pins of the IC 10. In exemplary embodiments, some MSIBs 100 may provide analog interfaces (designated with "A" in FIG. 1) for providing input and/or output analog functionality. The analog interfaces may accommodate a variety of physical signaling schemes, such as voltage or current levels, etc., as persons of ordinary skill in the art understand.

In some embodiments, some MSIBs 100 may provide digital interfaces (designated with "D" in FIG. 1) for providing digital input and/or output functionality, for example digital interfaces using common, standard, or conventional signal levels, protocols, etc. Examples include transistor-transistor logic (TTL), complementary metal oxide semiconductor (CMOS) logic, and the like. As persons of ordinary skill in the art understand, a variety of other digital signaling schemes and protocols are possible in exemplary embodiments.

In some embodiments, some MSIBs 100 may provide digital interfaces (designated with "D'" in FIG. 1) for providing digital input and/or output functionality, for example digital interfaces using unusual, proprietary, or non-common signal levels, protocols, etc. For example, such MSIBs 100 may accommodate a logic signaling scheme where a binary 0 corresponds to 2V and a binary 1 corresponds to 3V in order to decrease the signal swing and thus increase speed of operation. As persons of ordinary skill in the art understand, a variety of other digital signaling schemes and protocols are possible in exemplary embodiments.

In some embodiments, some MSIBs 100 may provide general purpose input output (GPIO) interfaces (e.g., the "digital interface" 115 in FIG. 1). In some embodiments, the GPIOs may provide analog interface capability. In some embodiments, the GPIOs may provide digital interface capability, whereas in other embodiments, the GPIOs may provide both analog and digital interface capability. In exemplary embodiments, the GPIOs may have fixed or programmable or configurable functionality, as desired, and as persons of ordinary skill in the art understand.

Figure 2:
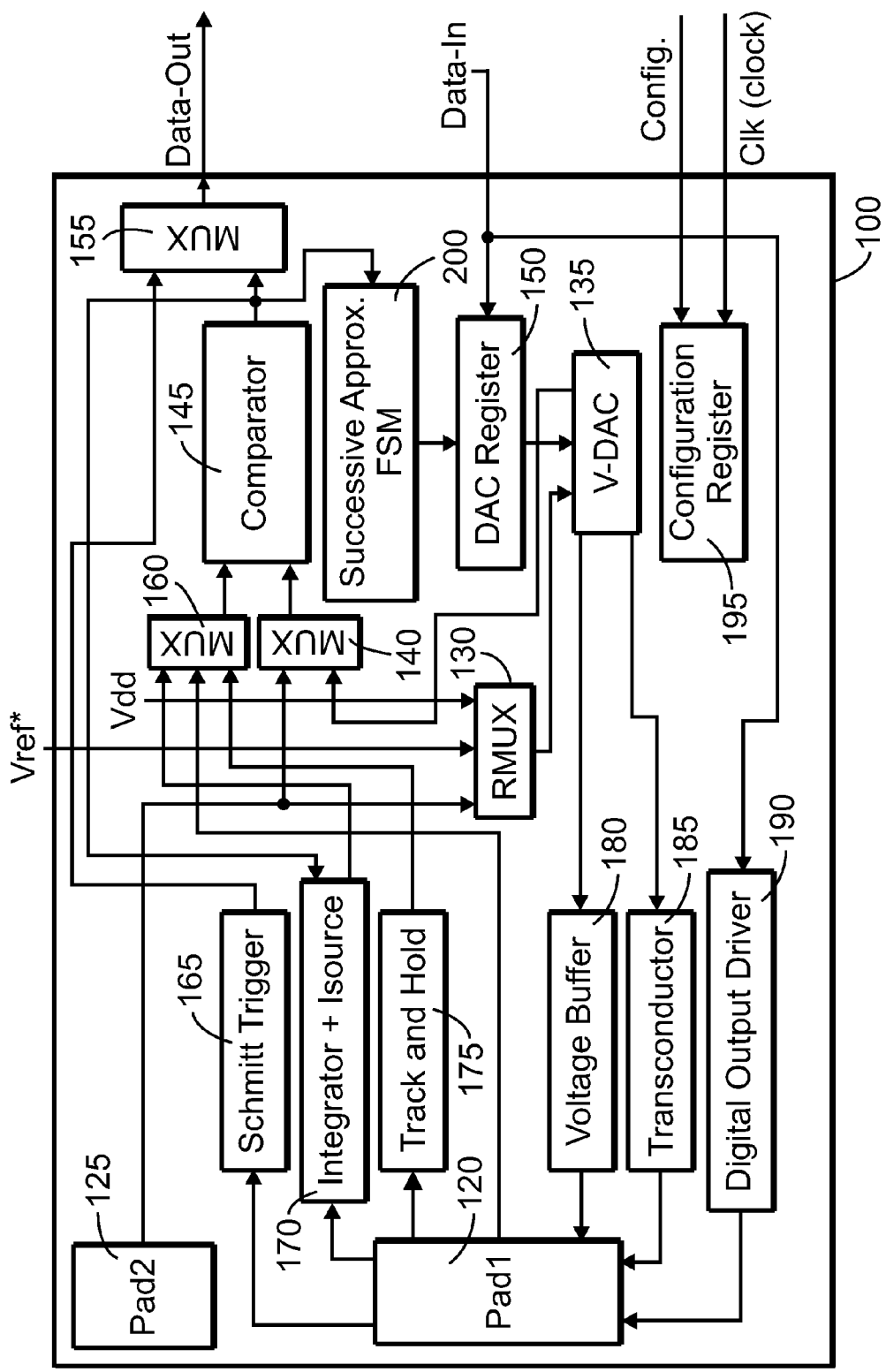
FIG. 2 shows a block diagram of an exemplary embodiment that includes a general embodiment of an MSIB.

FIG. 2 shows a block diagram of an exemplary embodiment that includes a general embodiment of an MSIB 100. In the embodiment shown, the MSIB couples to two pads 120 and 125 (labeled "pad1" and "pad2") of the IC. The MSIB 100 can provide two-pin analog and/or digital GPIO capability. The embodiment shown in FIG. 2 can provide current and voltage mode DACs, fast low resolution SAR ADC and slow high resolution delta sigma ADC), a variety of comparator modes, ratiometric conversion for ADCs and DACs, and full GPIO functionality.

An analog signal at pad2 125 is applied to the RMUX 130 (a reference multiplex unit), as are a reference voltage Vref* and a supply voltage Vdd. The output of the RMUX 130 is provided as a reference voltage to a V-DAC 135 (voltage digital-to-analog converter). In response to the reference voltage and the control signal(s) from a successive approximation (SAR) finite state machine (FSM) and DAC register, the V-DAC 135 provides an output voltage to a first MUX 140 that supplies an input signal to the comparator 145. The first MUX 140 also receives the signal at pad2 125 as another input.

The DAC register 150 controls the output of the V-DAC circuit 135, according to the equation $Vout=Vref*D/2^N$, where N represents the length of the DAC digital data word. During DAC operation, the DAC register 150 may be written to through the data input line of the MSIB.

In response to control signals (not shown), which may be, for example, derived from the configuration register, which receives MSIB configuration data in response to a clock signal "clk," the first MUX 140 provides one of its input signals to the comparator 145. The output of the comparator 145 drives a second MUX 155, which provides the output data of the MSIB.

A second input of the comparator 145 receives an output signal of a third MUX 160. The third MUX 160 receives its input signals from several blocks, including the Schmitt trigger circuit 165, the integrator/current source 170 (labeled "integrator+isource") circuit, a track and hold circuit 175, and the signal at pad1 120. In response to control signals (not shown), which may be, for example, derived from the configuration register, the third MUX 160 provides one of its input signals to the comparator 145.

The Schmitt trigger 165 in exemplary embodiments may have programmable hysteresis levels. The integrator/current source 170, along with other circuitry of the MSIB 100, may be used as a building block for a delta-sigma converter. The track and hold circuit 175 may be used to implement a SAR circuit.

Rather than receiving input signals, pad1 120 may be configured to provide output signals. More specifically, pad1 120 may supply the output of a voltage buffer 180, a transconductor 185, or a digital output driver 190. The voltage buffer 180 provides buffering of the output voltage of the V-DAC circuit 135. The transconductor 185 may convert the output voltage of the V-DAC circuit 135 to a current.

The digital output driver 190 may provide buffering or driving functionality, and may provide to pad2 125 information received from the configuration register 195 or from the input data of the MSIB 100. The digital output driver 190 may have programmable slew rate, drive strength, open drain, or standard CMOS capabilities.

The configuration register 195 receives configuration information or data for the MSIB 100. The configuration information or data may be receives from a desired source, such as the core circuitry 105 of the IC 10. The configuration register 195 can use the configuration information or data to configure or program or adapt one or more blocks or circuits in the MSIB 100, as desired, depending on the implementation for a given specification or situation. Thus, in exemplary embodiments, the configuration register 195 may provide enable, disable, parameter setting (e.g., hysteresis, slew rate, etc.) for one or more blocks or circuits of the MSIB 100.

As persons of ordinary skill in the art understand, the structure and functionality described above is exemplary, and many other configurations, structures, and functions may be realized. For example, in some embodiments, some of the blocks or circuits of the MSIB 100 may have programmable functionality and/or parameters (see above for examples). As another example, all or nearly all (e.g., excepting the MUXs) blocks in the MSIB 100 may have programmable functionality and/or parameters.

As noted above, the MSIB 100 shown in FIG. 2 supports a variety of functions or operating modes. Some of the blocks of circuitry in the MSIB 100 may not be used for a particular function or operating mode. Such blocks may in some of the appended drawings be shown with lighter gray (or dashed-line or other notation) outlines and connections. As an example, the track and hold block 175, the comparator 145, etc., are not used to implement the functionality described below with respect to the circuit shown in FIG. 3.

Figure 3:
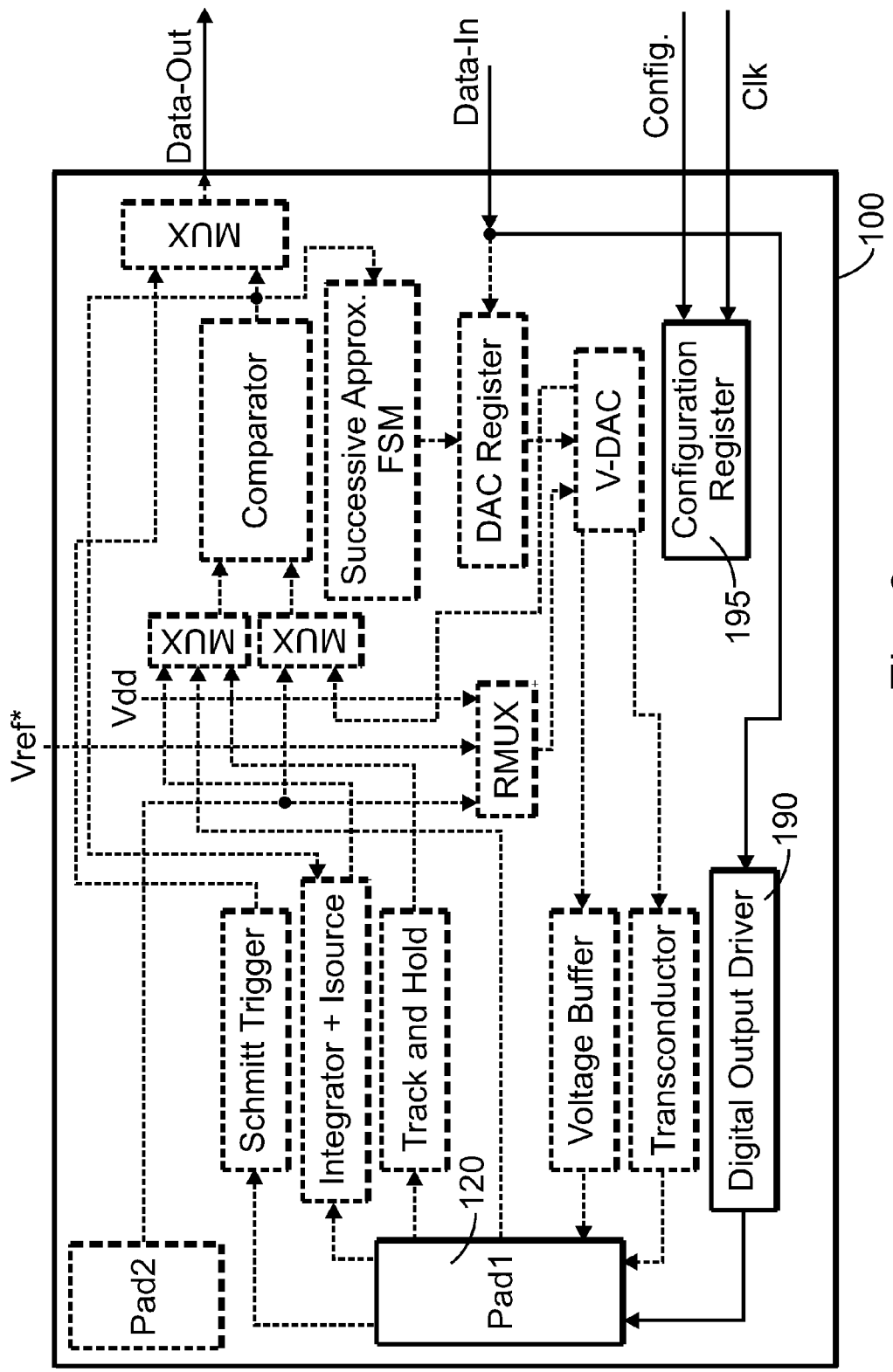
FIG. 3 shows an MSIB configured to provide digital output functionality according to an exemplary embodiment.

FIG. 3 shows an MSIB 100 configured to provide digital output functionality according to an exemplary embodiment. In this mode, pad1 120 provides as a digital output a signal received from the digital output driver 190. The digital output driver 190 buffers or processes or conditions a signal received as the data input of the MSIB 100, and provides the resulting signal to pad1 120.

In some embodiments, the MSIB 100 may uses CMOS digital circuits (e.g., standard CMOS circuits) to implement a fast CMOS output with strong drive, as desired. In some embodiments, the MSIB 100 may provide options to disable the pullup of the CMOS output (e.g., to provide open drain functionality), program the drive strength, control the slew rate, etc., as desired, and as persons of ordinary skill in the art understand.

Figure 4:
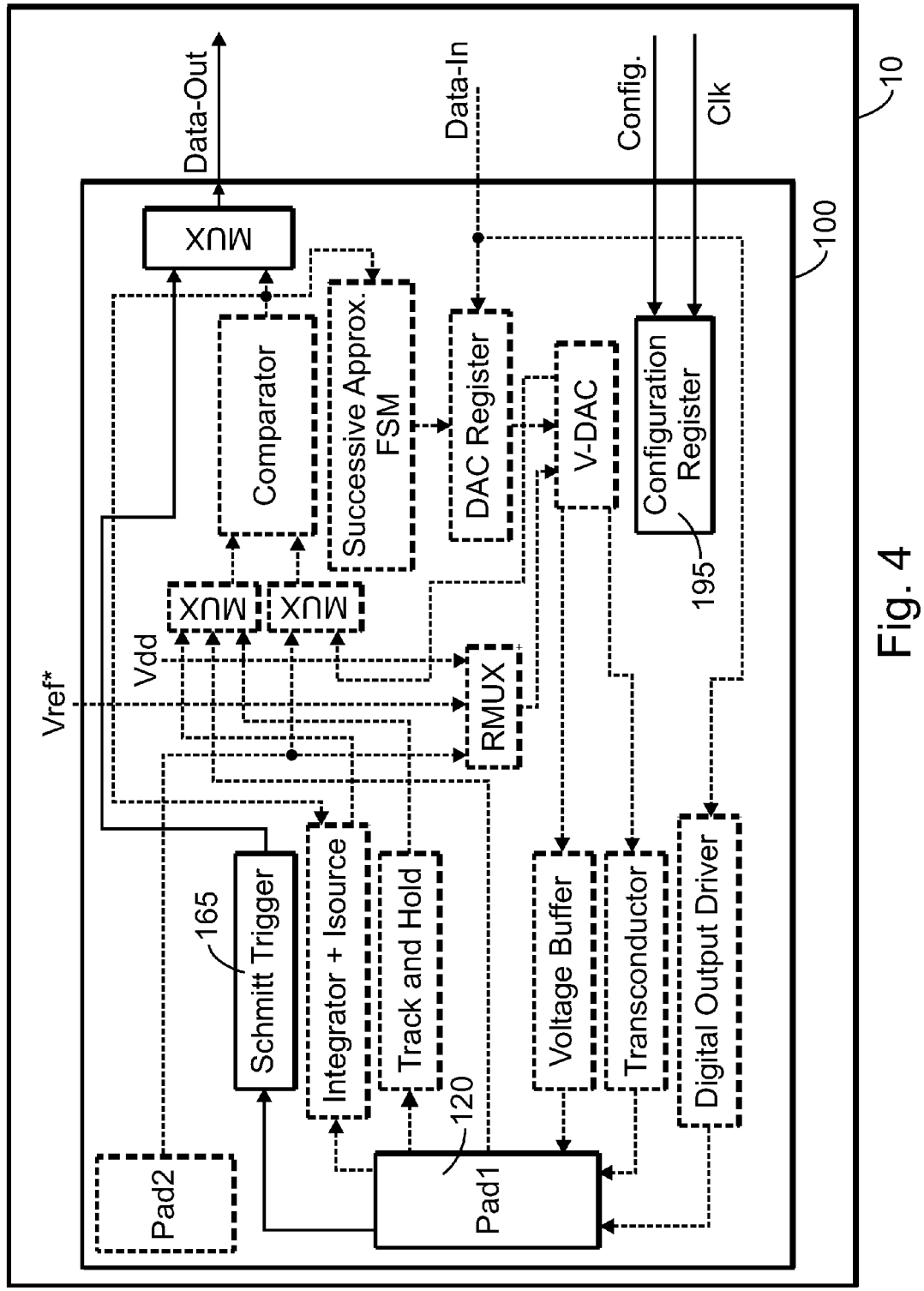
FIG. 4 shows an MSIB configured to provide digital input functionality according to an exemplary embodiment.

FIG. 4 shows an MSIB 100 configured to provide digital input functionality according to an exemplary embodiment. In this mode, pad1 120 receives an input signal, and provides the signal to the Schmitt trigger 165. The Schmitt trigger 165 processes the input signal, and provides the resulting signal as the data output signal of the MSIB 100 via the second MUX 155.

Thus, in this mode, pad1 120 may be configured similar to a standard or typical digital input pad. The Schmitt trigger 165 implements input buffering, with optional hysteresis, which may be programmed via the configuration register 195. The functionality of the MSIB 100 in this mode may be configured or programmed for CMOS, TTL, or other input levels, as desired.

Figure 5:
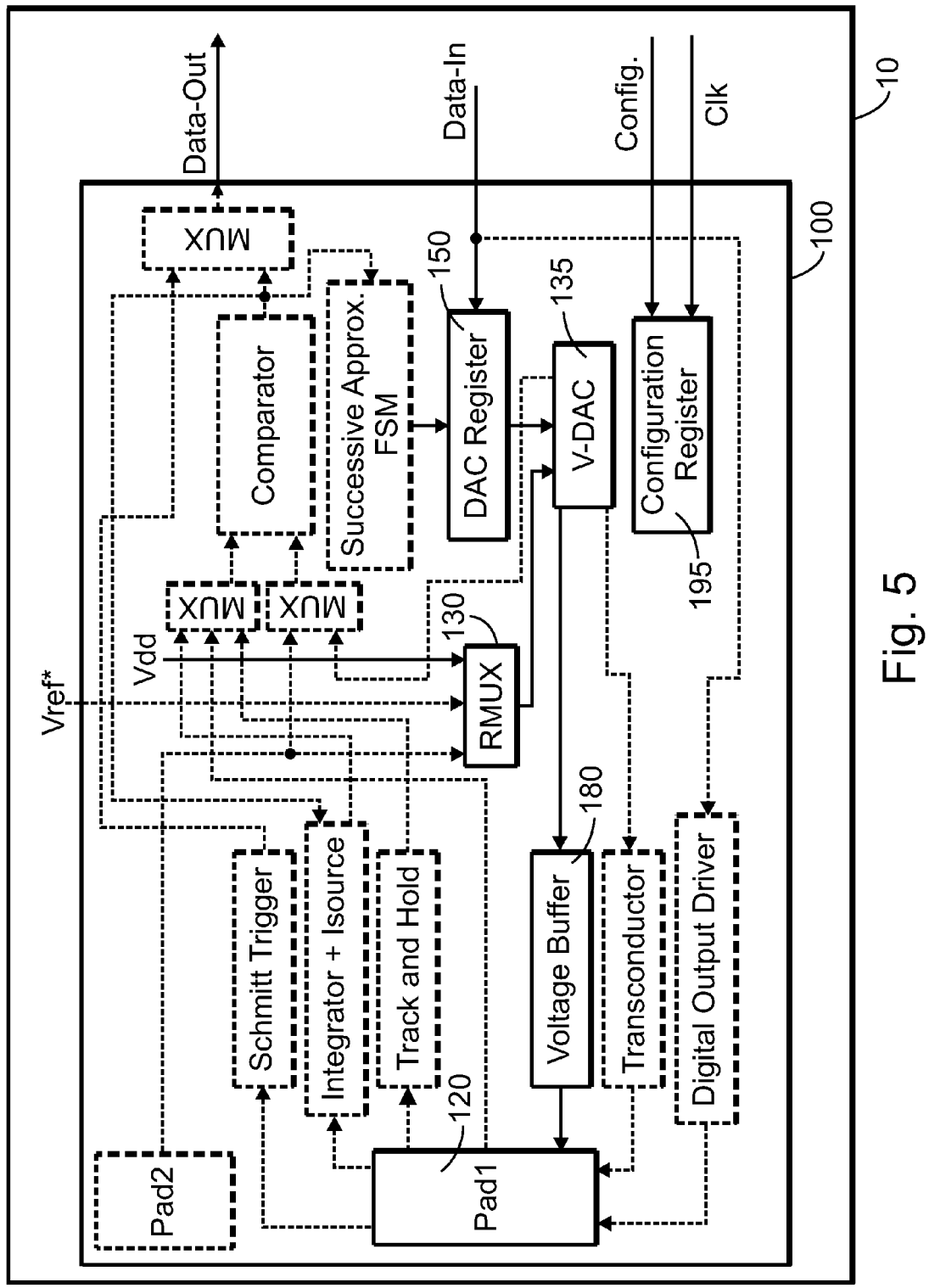
FIGS. 5-6 shows an MSIB configured to provide voltage digital to analog (DAC) functionality according to an exemplary embodiment.

FIG. 5 shows an MSIB 100 configured to provide voltage DAC functionality according to an exemplary embodiment. In this mode, the data to be converted to the analog domain may be provided to the data input of the MSIB 100, for example, by a digital circuit in the core circuitry 105 (or 110) of the IC 10.

The V-DAC circuit 135 creates an analog voltage level according to the received digital code or signal and the reference voltage provided to the V-DAC circuit 135. The digital code or signal is provided via the data input of the MSIB 100 to the DAC register 150. The DAC register 150 provides a register function, and provides the digital code or signal to the V-DAC circuit 135.

The V-DAC circuit 135 provides to the voltage buffer 180 the analog voltage that results from the digital to analog conversion. The voltage buffer 180 buffers the analog voltage and provides the resulting signal to pad1 120, which in turn provides the buffered signal to other circuitry (not shown). The voltage buffer 180 may have programmable parameters (e.g., drive strength), and may give the MSIB 100 the capability to drive pad1 120 in the presence of relatively large capacitive loads or relatively small resistive loads (or both).

Figure 6:
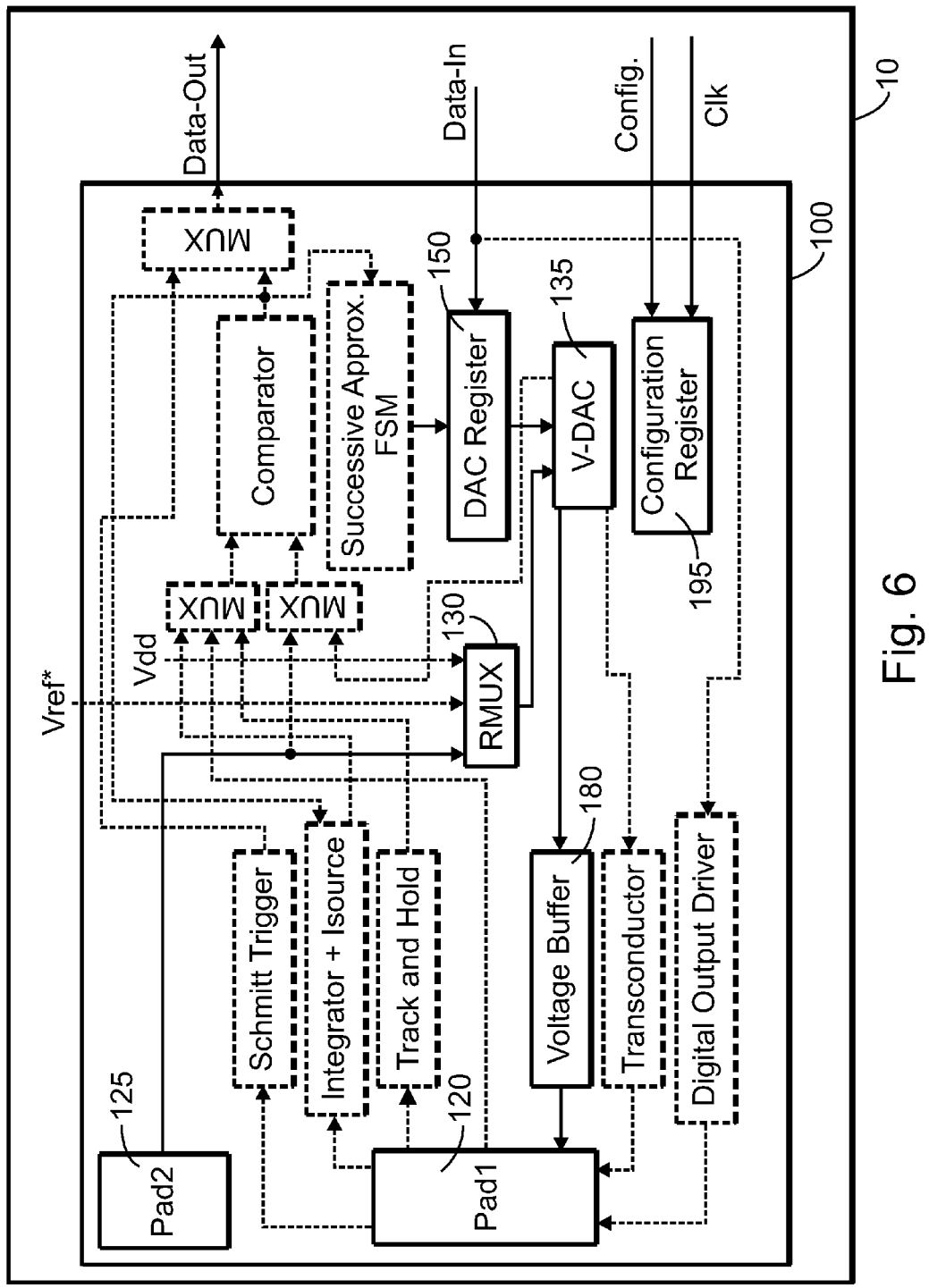

The reference voltage provided to the V-DAC circuit 135 may be a bandgap voltage generated on chip, the supply voltage of the MSIB 100, or an external reference provided to pad2 125. The RMUX 130 provides one of those voltages as the reference voltage of the V-DAC circuit 135. FIG. 6 shows the situation where a voltage provided to pad2 125 serves as the reference voltage provided to the V-DAC circuit 135.

Figure 7:
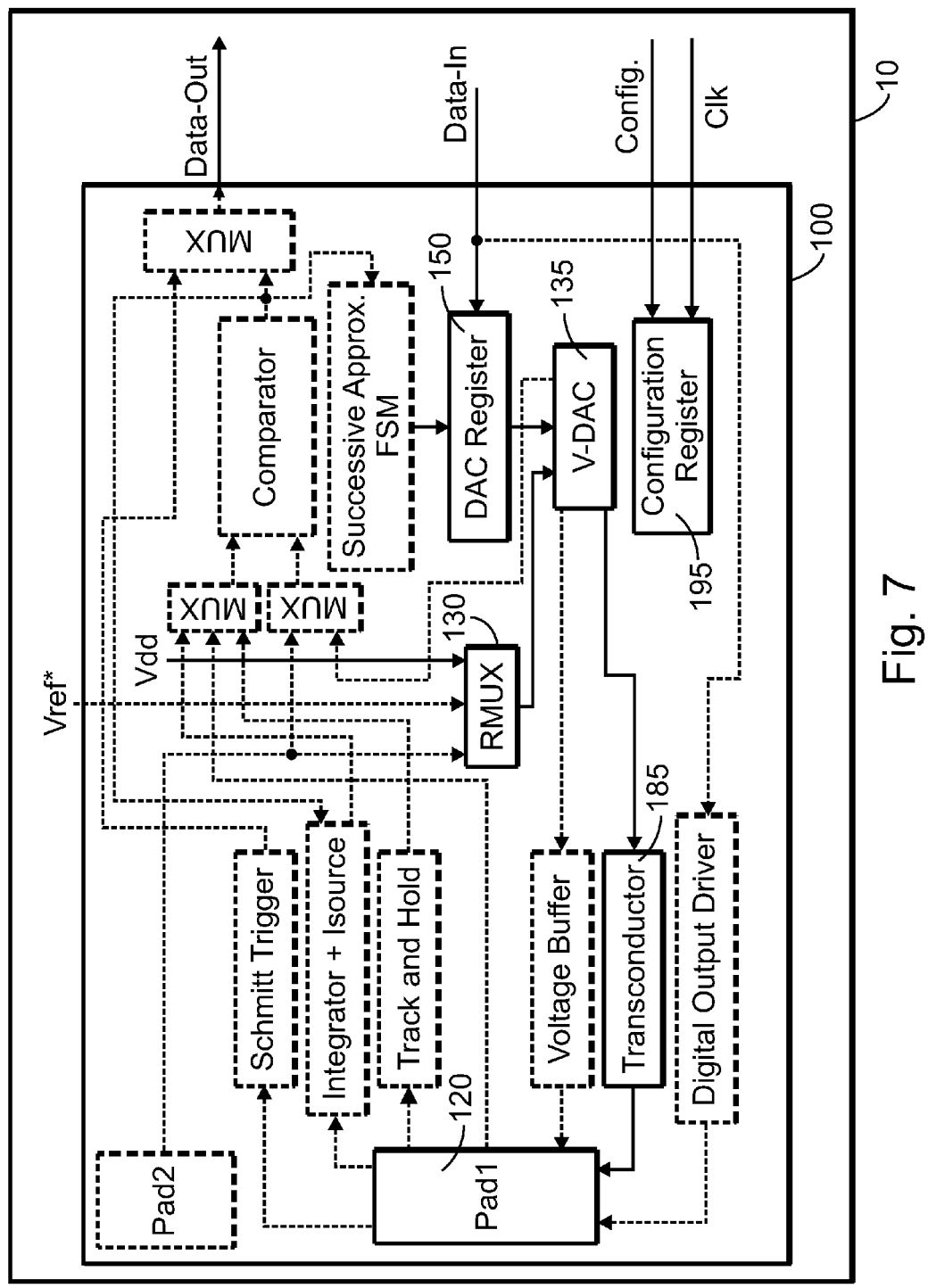
FIG. 7 shows an MSIB configured to provide current DAC functionality according to an exemplary embodiment.

FIG. 7 shows an MSIB 100 configured to provide current DAC functionality according to an exemplary embodiment. The operation of the MSIB 100 in this mode is similar to the voltage DAC functionality described above. The output voltage of the V-DAC circuit 135, however, is provided to the transconductor circuit 185.

The transconductor circuit 185 converts to an analog current the analog voltage provided by the V-DAC circuit 135. The resulting analog current is then provided to pad1 120 and, thus, ultimately to any circuit coupled to pad1 120. Similar to the voltage DAC mode, the reference signal for the V-DAC circuit 135 may be selected via the RMUX 130, as described above in detail.

Figure 8:
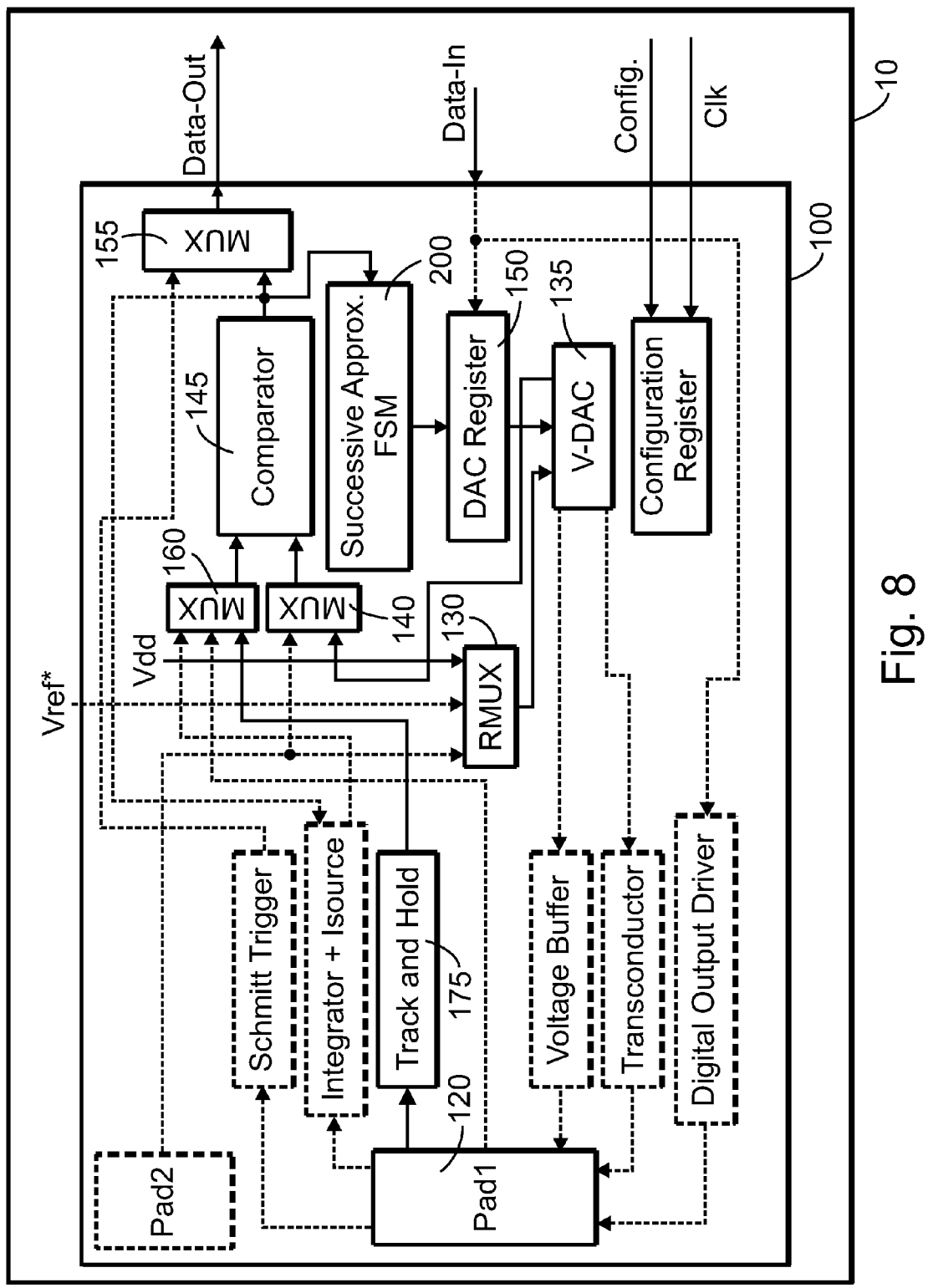
FIG. 8 shows an MSIB configured to provide successive approximation register (SAR) analog to digital (ADC) functionality according to an exemplary embodiment.

FIG. 8 shows an MSIB 100 configured to provide SAR ADC functionality according to an exemplary embodiment. In this mode, an analog signal received at pad1 125 is provided to the track and hold circuit 175. The track and hold circuit 175 samples the input signal.

The output of the track and hold circuit 175 is coupled to one input of the comparator 145. The output of the comparator 145 is provided to the successive approximation FSM 200. A successive approximation technique is used to provide digital data for ultimately driving the V-DAC circuit 135, as persons of ordinary skill in the art understand. Briefly, for each bit position from high value to low, the bit at that position is set, then a check is made of the comparator 145 output. The bit is reset if the comparator 145 returns a signal that indicates a 'too high' level. This process is repeated for every bit position. During the ADC operation of the MSIB 100, the SAR FSM controls the DAC register 150 according to this process.

The output of the successive approximation FSM 200 feeds the input of the DAC register 150. The output of the DAC register 150 is provided to the input of the V-DAC circuit 135. The output of the V-DAC circuit 135 drives the second input of the comparator 145. Thus, a feedback circuit is formed around the comparator 145.

The output of the comparator 145 provides digital data resulting from the analog-to-digital conversion. The digital data may be provided to desired destinations, such as the core circuitry 105 (or 110) of the IC, via the data output signals/lines of the MSIB 100.

Although FIG. 8 shows the V-DAC circuit 135 as receiving the supply voltage Vdd as a reference voltage, other configurations are possible in exemplary embodiments. For example, as described above, external or internal voltages may be used as the reference voltage for the V-DAC circuit 135.

Figure 9:
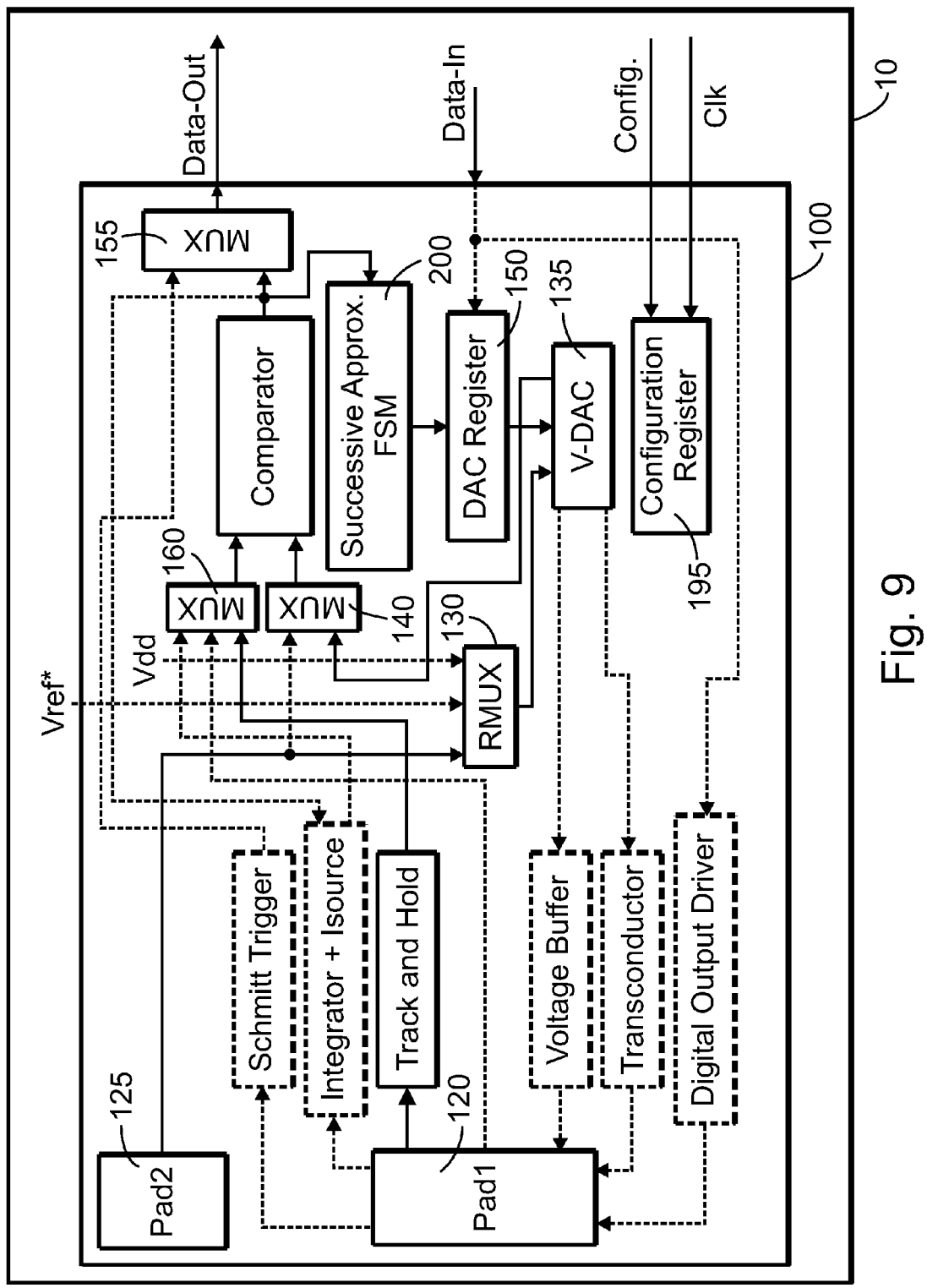
FIG. 9 shows an MSIB configured to provide ratiometric SAR ADC functionality according to an exemplary embodiment.

FIG. 9 shows an MSIB 100 configured to provide ratiometric SAR ADC functionality according to an exemplary embodiment. In this mode of an operation, an external reference voltage provided at pad2 125 may be used to implement the ratiometric SAR ADC functionality. In this mode, the analog-to-digital conversion occurs as described above, except that an analog signal received at pad2 125 is provided to the V-DAC circuit 135 as the reference voltage.

Consequently, the output digital data represent the ratio of the voltage at pad1 120 to the voltage present at pad2 125. The ratiometric ADC provides for additional functionality for the MSIB 100. Examples include measurement of impedance, potentiometer position, resistor dividers, etc., as persons of ordinary skill in the art understand.

Figure 10:
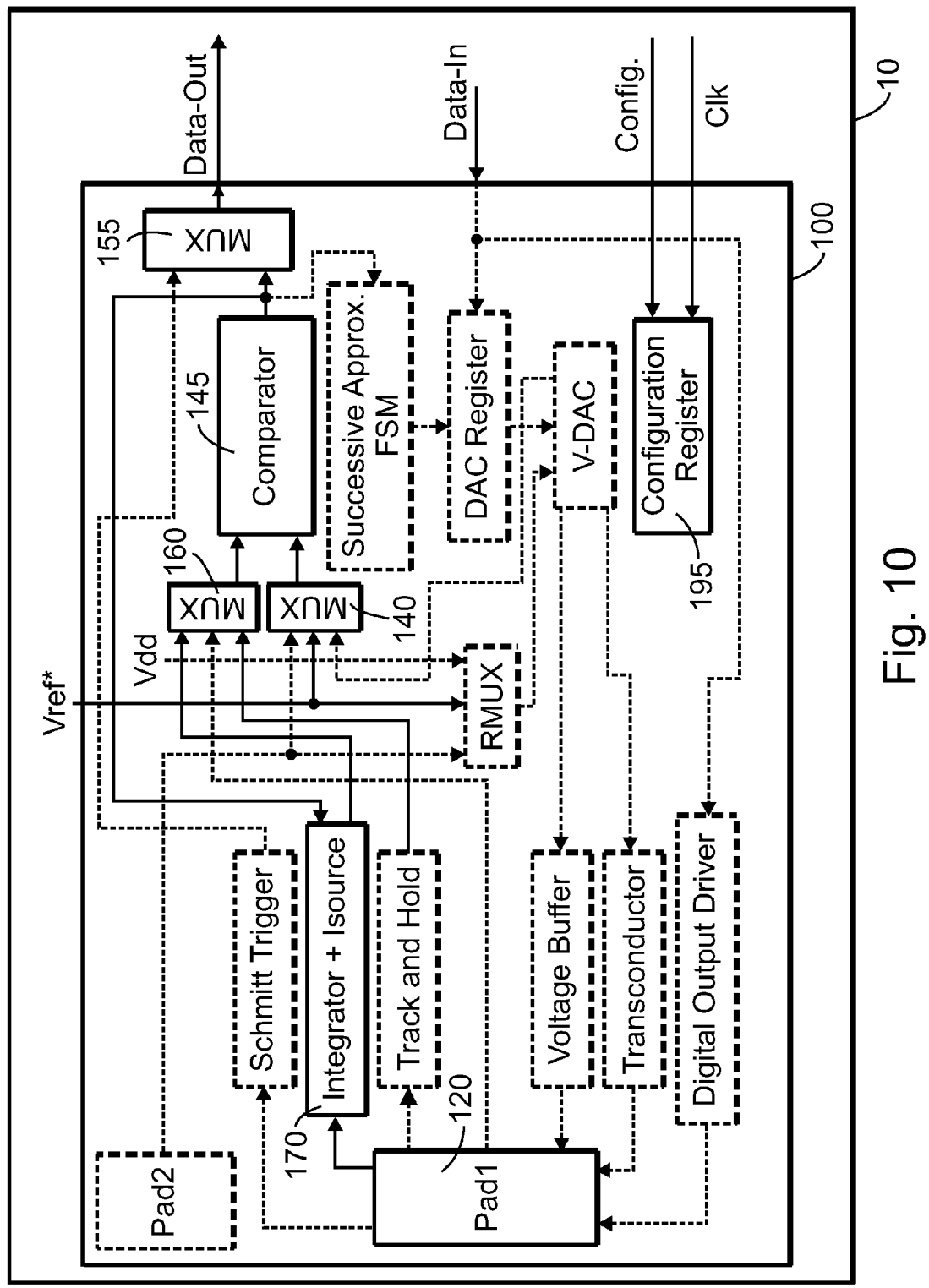
FIG. 10 shows an MSIB configured to provide delta sigma ADC functionality according to an exemplary embodiment.

FIG. 10 shows an MSIB 100 configured to provide delta sigma ADC functionality according to an exemplary embodiment. In this mode, a high precision low speed analog to digital conversion may be implemented.

The output signal of the integrator/current source circuit 170 drives one input of the comparator 145. The reference voltage Vref* drives another input of the comparator 145. The output of the comparator 145 provides a feedback signal to the integrator/current source circuit 170.

The analog voltage to be converted to the digital domain is received at pad1 125. The integrator/current source circuit 170 integrates the difference between the input voltage, as it is converted to a current to be integrated, and a feedback current source driven by the output signal of the comparator 145.

As noted above, in exemplary embodiments, the MSIB 100 includes a transconductor circuit and a voltage buffer. In some embodiments, the transconductor circuit or the voltage buffer may be used to provide the functionality of the integrator (rather than using a dedicated integrator).

Figure 11:
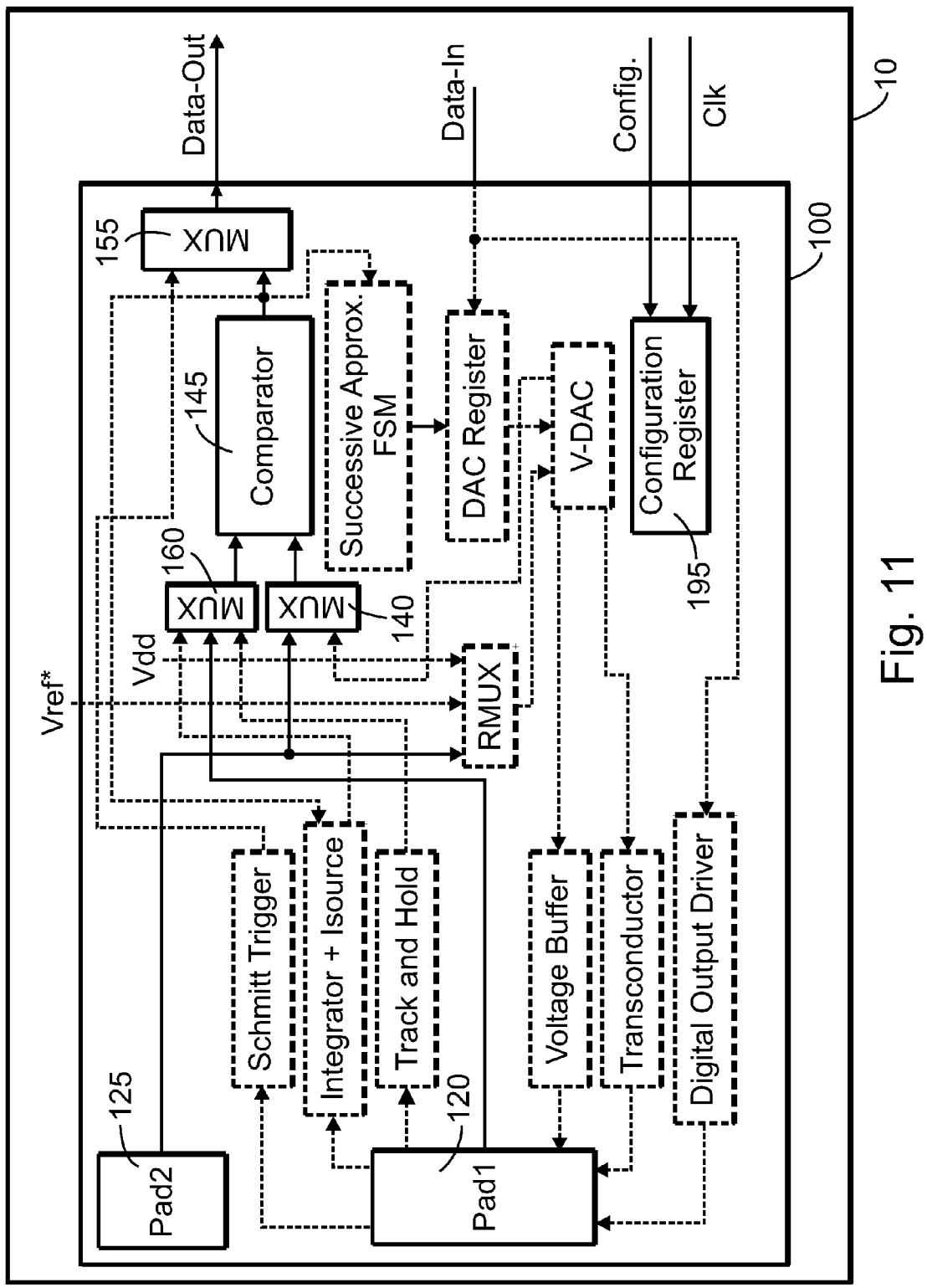
FIG. 11 shows an MSIB configured to provide differential comparator functionality according to an exemplary embodiment.

FIG. 11 shows an MSIB 100 configured to provide differential comparator functionality according to an exemplary embodiment. In this mode, signals applied to or received at pad1 120 and pad2 125 are provided to the respective inputs of the comparator 145. As a result, the comparator 145 may function as a differential comparator. (Of course, as persons of ordinary skill in the art understand, grounding pad1 120 or pad2 125 provides a single-ended, rather than differential, comparator function.)

Figure 12:
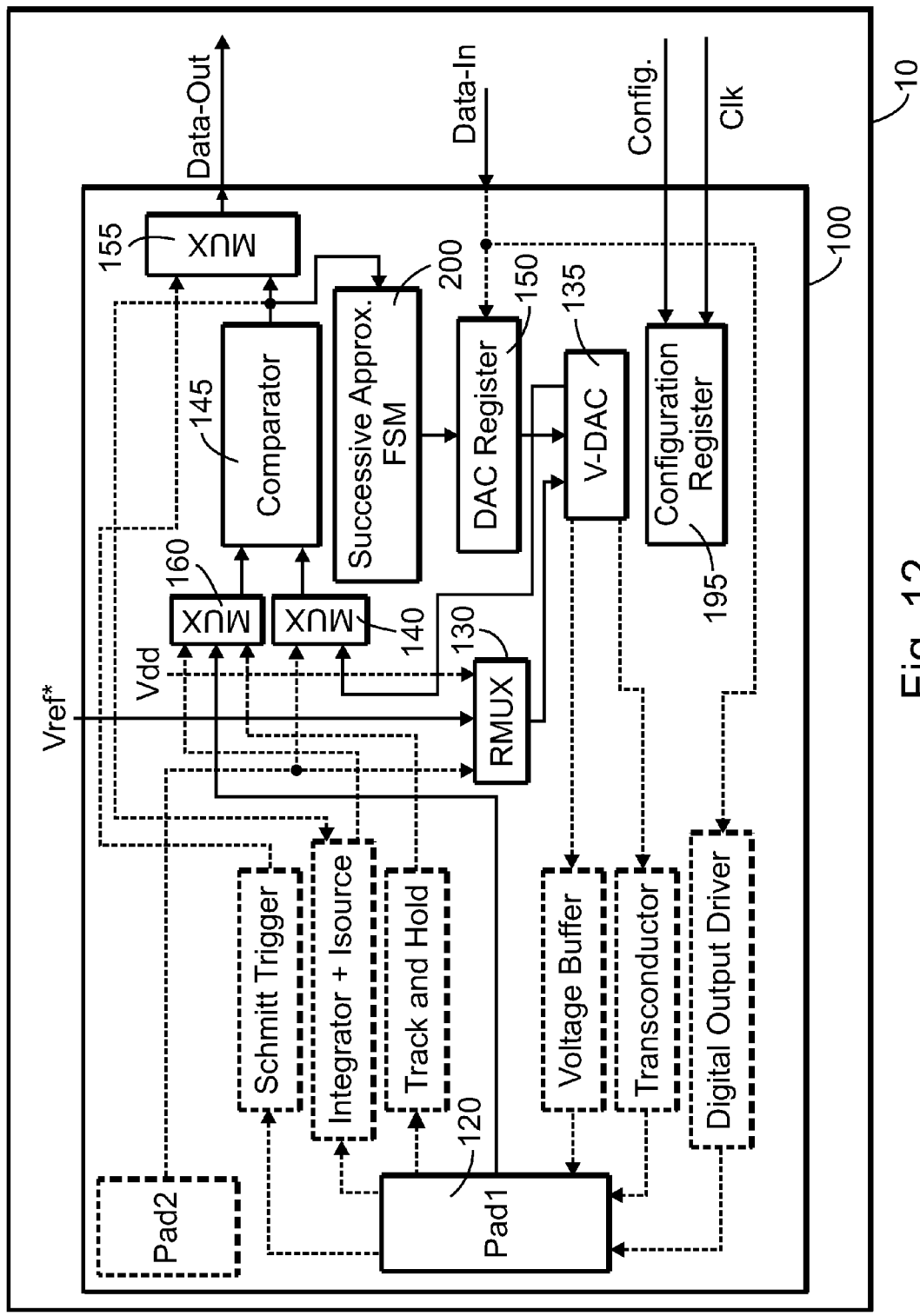
FIG. 12 shows an MSIB configured to provide the functionality of a comparator with programmable threshold, according to an exemplary embodiment.

FIG. 12 shows an MSIB 100 configured to provide the functionality of a comparator with programmable threshold, according to an exemplary embodiment. In this mode of operation, a voltage applied to pad1 120 is coupled to an input of the comparator 145. The output of the V-DAC circuit 135 is coupled to a second input of the comparator 145. The output voltage of the V-DAC circuit 135 provides the threshold voltage for the comparator 145.

The comparator 145 compares the voltages applied to its inputs, and provides a resulting output voltage via the data outputs of the MSIB 100. For example, when the input voltage at pad1 120 exceeds the output voltage of the V-DAC circuit 135 (i.e., the threshold voltage), the comparator 145 may provide a binary logic 1 as output data.

The reference voltage applied to the V-DAC circuit 135 programs the threshold of the comparator 145. As noted, a choice of reference voltages may be used. For example, in some embodiments, the supply voltage or an external voltage (applied to pad2) may be used instead of Vref* to program the comparator threshold voltage.

In some embodiments, hysteresis may be added to the comparator 145. One way of implementing the hysteresis is by adjusting the V-DAC reference level according to the previous decision of the comparator 145. For example, if the previous decision was a binary logic 1, the threshold of the V-DAC circuit may lowered, so that a noticeable change of the input voltage has to take place to return the comparator output to a binary logic 0. This operation can be useful in a variety of situations, as persons of ordinary skill in the art understand. Examples include implementing a digital interface with unusual or arbitrary signaling levels or protocols.

In some embodiments, a window comparator may be implemented, as desired. The window comparator may be implemented by a successive test to two distinct levels (corresponding to the window thresholds), and the judgment whether the input signal is inside or outside of the window.

Figure 13:
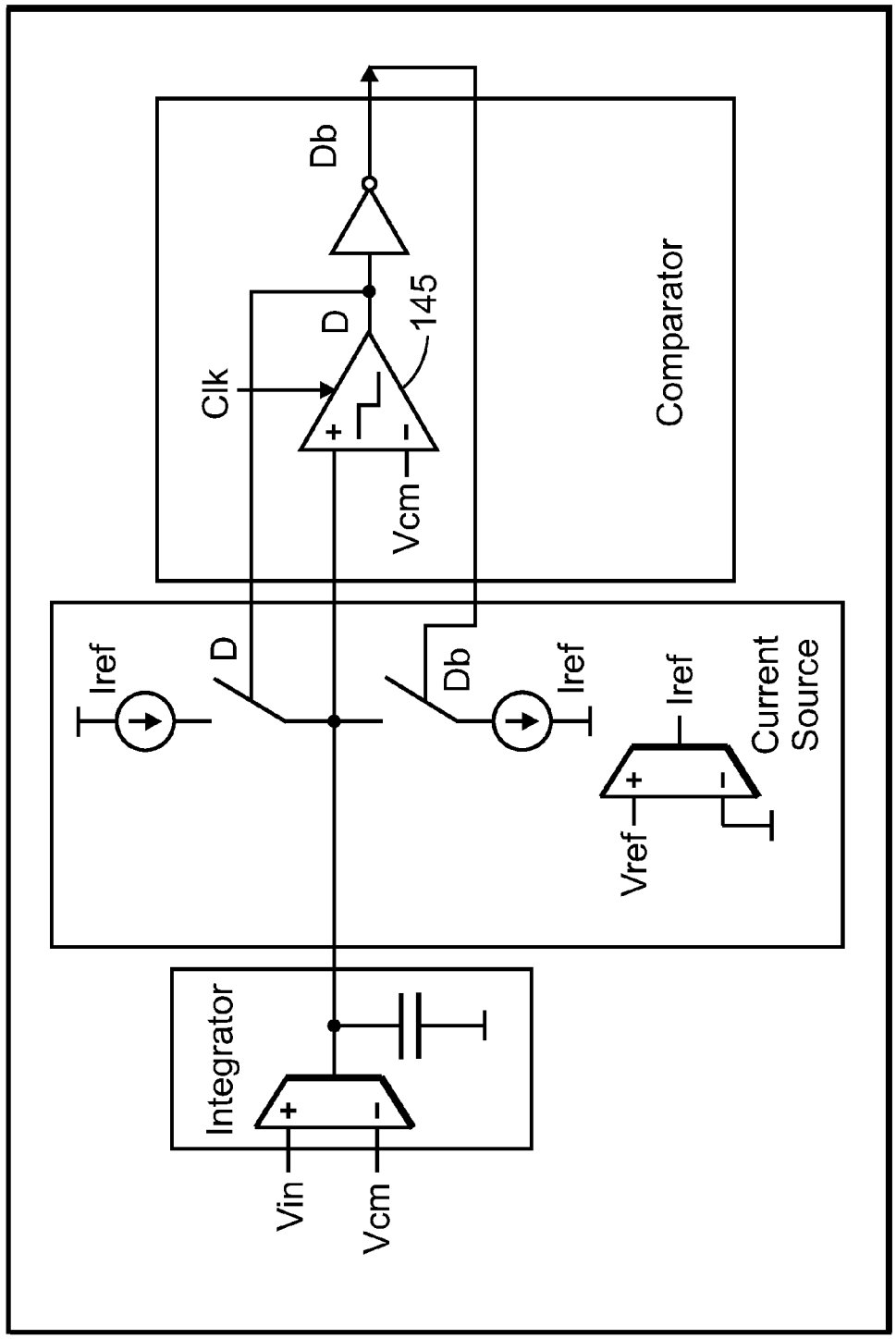
FIG. 13 shows a delta sigma modulator for an MSIB according to an exemplary embodiment.

FIG. 13 shows a delta sigma modulator for an MSIB 100 according to an exemplary embodiment. The modulator may be used in MSIB 100s to provide functionality of a delta sigma modulator.

The delta sigma modulator in the embodiment shown is implemented by integrating currents through a capacitor. The input voltage is converted to a current with a transconductor circuit. The reference voltage is also converted to a current with a transconductor circuit to generate a signal Iref.

The integrated voltage on the capacitor is observed by a comparator. The output of the comparator controls feedback in the circuit. Specifically, the output of the comparator is used to generate signals D and Db. Signals D and Db control switches that couple the current Iref to the capacitor and an input of the comparator. The output of comparator may be provided to various circuitry, such as the core circuitry of the IC.

In some implementations, the full functionality of the MSIB 100s described above may not be required or specified. In exemplary embodiments, the functionality of MSIBs 100 may be scaled to fit a given situation, a desired implementation, or a given set of specifications. The following description provides details of some exemplary embodiments with reduced or different functionality than provided in the MSIB 100 in FIG. 2.

Figure 14:
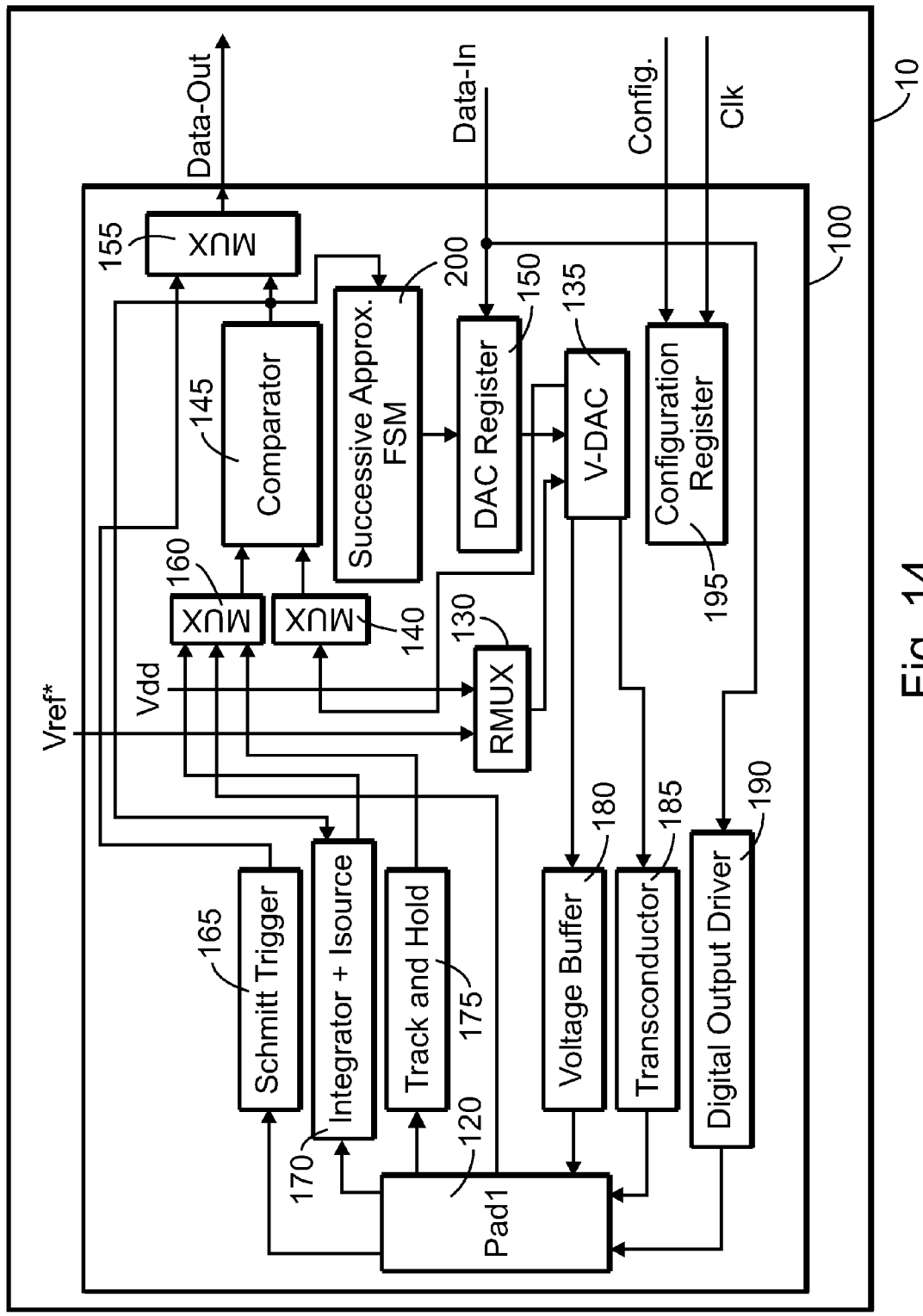
FIGS. 14-16 show block diagrams of exemplary embodiments that include general embodiments of MSIBs.

FIG. 14 shows a block diagram of an exemplary embodiment that includes a general embodiment of an MSIB 100 with reduced functionality compared to the MSIB 100 shown in FIG. 2. Specifically, the MSIB 100 shown in FIG. 14 provides analog or digital GPIO functionality for one pad (labeled as "pad1" 120). Various blocks and circuits are similar to the corresponding blocks and circuits in FIG. 2, described above in detail.

The exemplary embodiment in FIG. 14 supports various modes of operation, such as current and voltage mode DACs, relatively fast and relatively low resolution SAR ADC, relatively slow and relatively high resolution SAR ADC, comparator with programmable threshold, full GPIO functionality. The embodiment in FIG. 14 does not support differential or ratiometric functions (because they use two input signals, hence, two pads).

Figure 15:
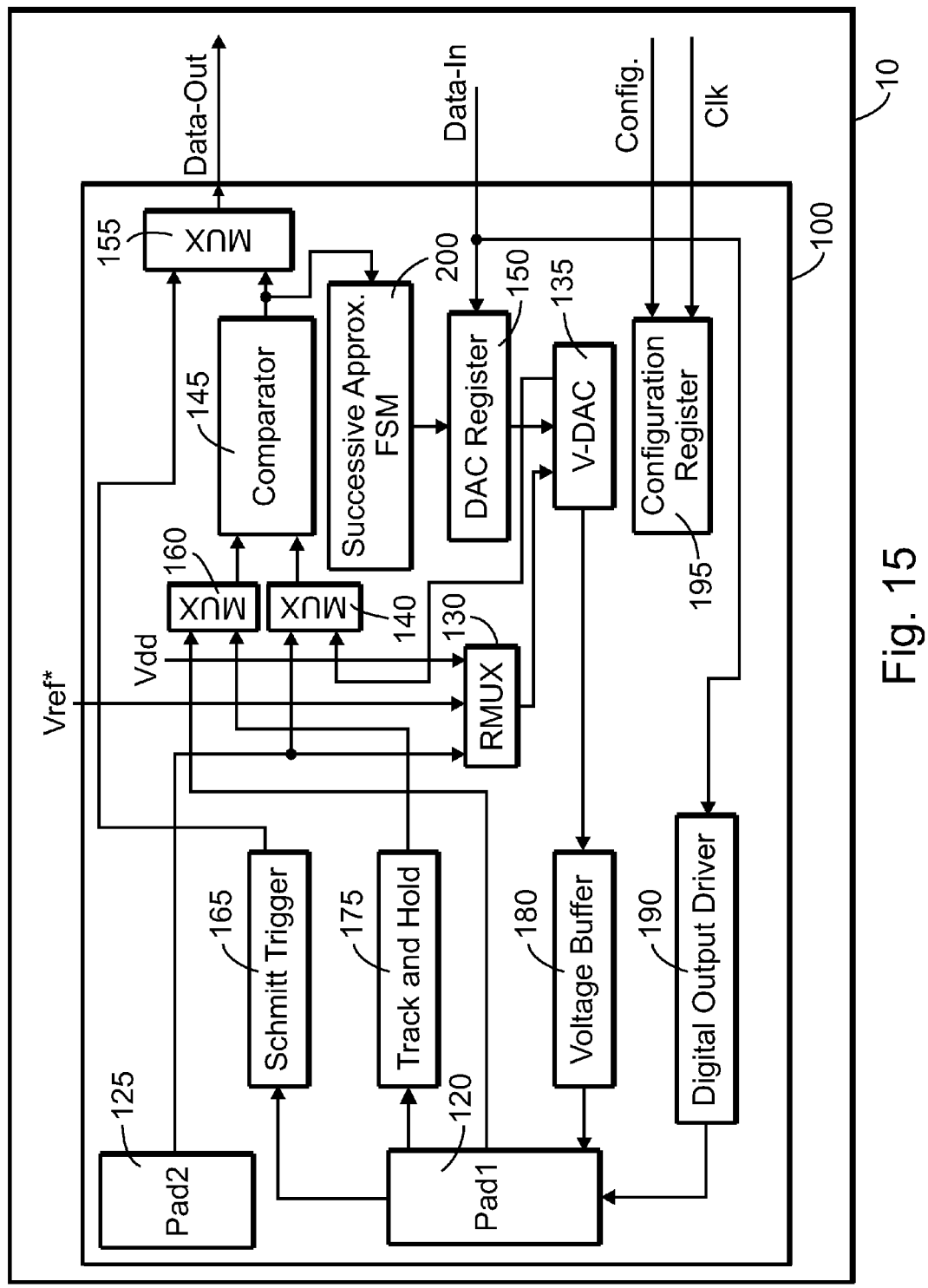

FIG. 15 shows a block diagram of an exemplary embodiment that includes a general embodiment of an MSIB 100 with reduced functionality compared to the MSIB 100 shown in FIG. 2. Compared to the MSIB 100 of FIG. 2, the MSIB 100 in FIG. 15 provides simpler analog/digital GPIO functionality.

More specifically, in the MSIB 100 of FIG. 15, the current DAC and delta sigma ADC modes are removed in order to save semiconductor area (and hence cost). The MSIB 100 of FIG. 15 provides full digital functionality, as well as full comparator functionality, one ADC mode, and one DAC mode.

Figure 16:
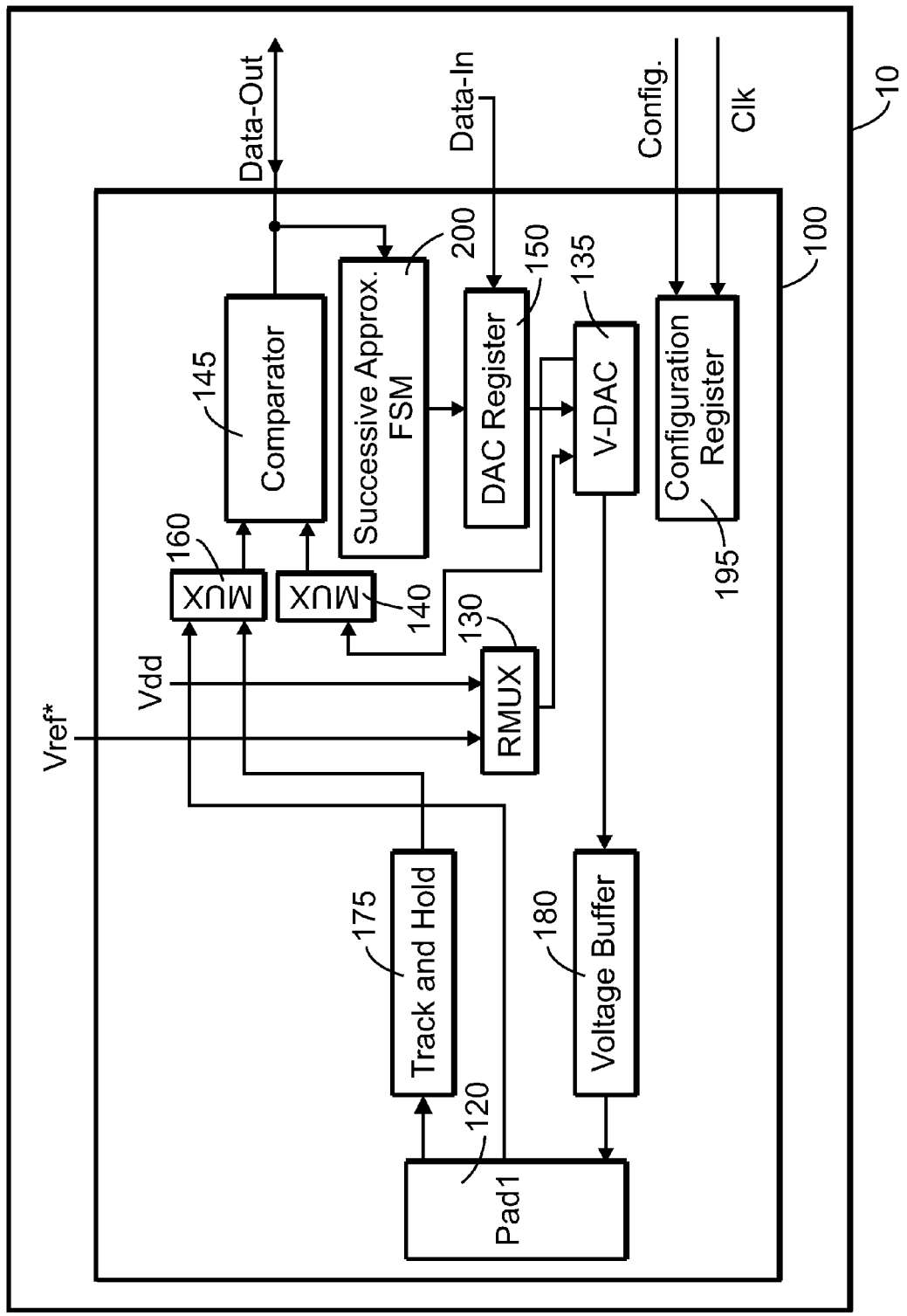

FIG. 16 shows a block diagram of an exemplary embodiment that includes a general embodiment of an MSIB 100 with reduced functionality compared to the MSIB 100 shown in FIG. 2. Specifically, the MSIB 100 in FIG. 16 provides analog GPIO functionality.

The MSIB 100 in FIG. 16 lacks differential and ratiometric modes, special digital circuits, and current DAC and delta sigma ADC modes (in order to reduce area and, hence, cost). Nevertheless, it maintains comparator, DAC, and ADC functionality. The MSIB 100 can receive and drive digital signals in response to analog signals.

In exemplary embodiments, some or all of the MSIB 100s may be implemented around pad circuitry (e.g., electrostatic discharge (ESD) protection circuitry, etc.). In other embodiments, MSIBs 100 may be implemented separately from the pad circuitry, and coupled to the respective pads or pad circuitry via suitable coupling mechanisms, as persons of ordinary skill in the art understand. As noted above, in some embodiments, a plurality of MSIBs 100 may be dedicated to a corresponding plurality of pads of IC 10.

As described above, the MSIBs 100 according to exemplary embodiments provide a flexible mechanism for providing interfacing and signal processing functions in mixed signal circuits and systems. By providing the ability to the designers to include and implement desired functions, the MSIBs 100 provide a way to balance desired functionality with semiconductor chip area, power consumption, manufacturing complexity, test complexity, cost, etc.

Another aspect of the disclosure relates to apparatus and techniques for information acquisition. More specifically, MSIBs according to exemplary embodiments may be used to provide a mechanism for asynchronous acquisition of information, such as signals, data, etc.

Figure 17:
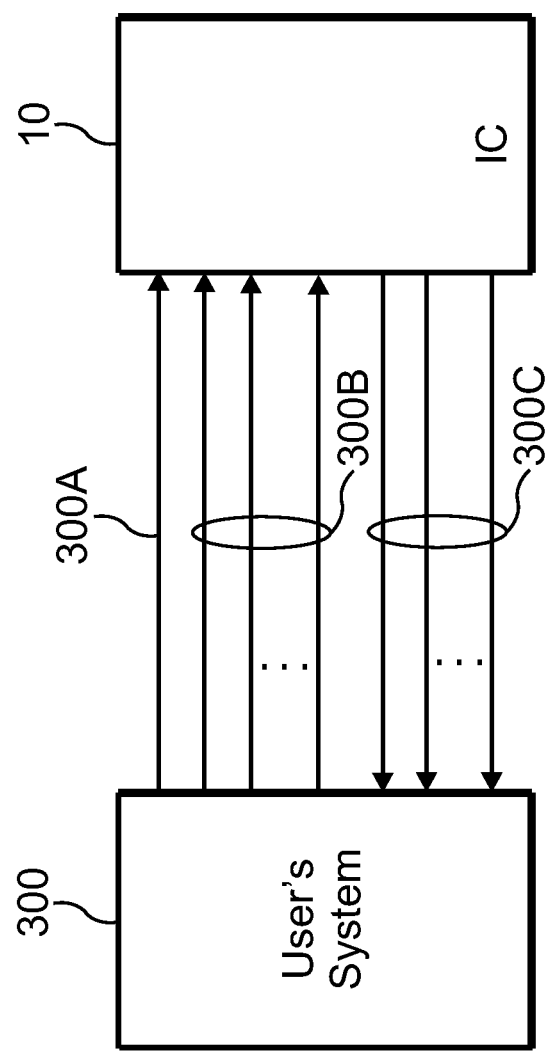
FIG. 17 shows a block diagram of an exemplary embodiment for asynchronous acquisition of information from a user's system.

FIG. 17 shows a block diagram of an exemplary embodiment for asynchronous acquisition of information using MSIBs. Specifically, the embodiment in FIG. 17 illustrates a user's system 300 coupled to IC 10 to provide for information exchange, control, etc. User's system 300 may include a wide range of circuitry, which may or may not be complete systems, such as circuits, subsystems, blocks, and the like.

User's system 300 couples to IC 10 via a set of links or coupling mechanisms 300A-300C. Through links 300A-300C, user's system may provide information (such as status or data and/or signals) to IC 10, and/or receive information from IC 10. Links 300A-300C may constitute wires, cables, printed-circuit board (PCB) traces, cables, backplane(s), conductors, and the like, as persons of ordinary skill in the art understand.

In the embodiment shown, link 300A provides a trigger signal to IC 10. IC 10 uses the trigger signal to cause information to be received from IC 10, information to be provided to IC 10, or both. The flow of information in either or both directions may occur asynchronously.

More specifically, IC 10 may include one or more clock signals or clock domains. The flow of information between user's system 300 and IC 10 may occur asynchronously with respect to one or more of the clock signals or clock domains. Note that, if desired, in some embodiments, the flow of information in one or both directions may occur synchronously. Generally speaking, however, link 300A may provide a trigger signal to IC 10 at any arbitrary point in time, regardless of the condition, value, or status of one or more clock signals or domains in or associated with IC 10.

If the information flows in one direction, i.e., from user's system 300 to IC 10, then IC 10 may acquire information about user's system 300. For example, in response to activation of a trigger signal (e.g., via link 300A), IC 10 may receive information from user's system 300 via links 300B. IC 10 may process the information, store the information, or both.

If the information flows in both directions, IC 10 may acquire information from user's system 300 and also provide information to user's system 300. For example, in response to activation of a trigger signal (e.g., via link 300A), IC 10 may receive information from user's system 300 via links 300B. IC 10 may process the information, store the information, or both.

More specifically, IC 10 may generate information to provide or send to user's system 300, and communicate the information to user's system 300 via links 300C. In this manner, a variety of flexible communication and control schemes may be realized. For example, IC 10 may provide the requisite processing to implement a control system that responds (by providing information via links 300C) in response to stimuli (information received via links 300B in response to a trigger signal received via link 300A).

Generally speaking, the information received via links 300B and communicated via links 300C may be in the analog or digital format, as desired. In some embodiments, the information received via links 300B may be in the analog format, and the information communicated via links 300C may be also in the analog format. In other embodiments, the information received via links 300B may be in the analog format, and the information communicated via links 300C may be in the digital format.

Other variations are also possible. For example, in some embodiments, the information received via links 300B may be in the digital format, and the information communicated via links 300C may be in the analog format. In still other embodiments, both the information received via links 300B and the information communicated via links 300C may use the digital format.

IC 10 may include desired converters to accommodate the type or format of information that user's system 300 provides or receives. For example, in the situation where the information received via links 300B uses the analog format, and user's system 300 expects to receive analog information via links 300C, IC 10 may include both ADC and DAC circuitry.

Thus, the ADC circuitry would convert the information received via links 300B to digital format. IC 10 would then process the resulting digital information, and produce digital information to be communicated to user's system 300. The DAC circuitry would convert the digital information to analog format, and provide the analog information to user's system 300 via links 300C.

Figure 18:
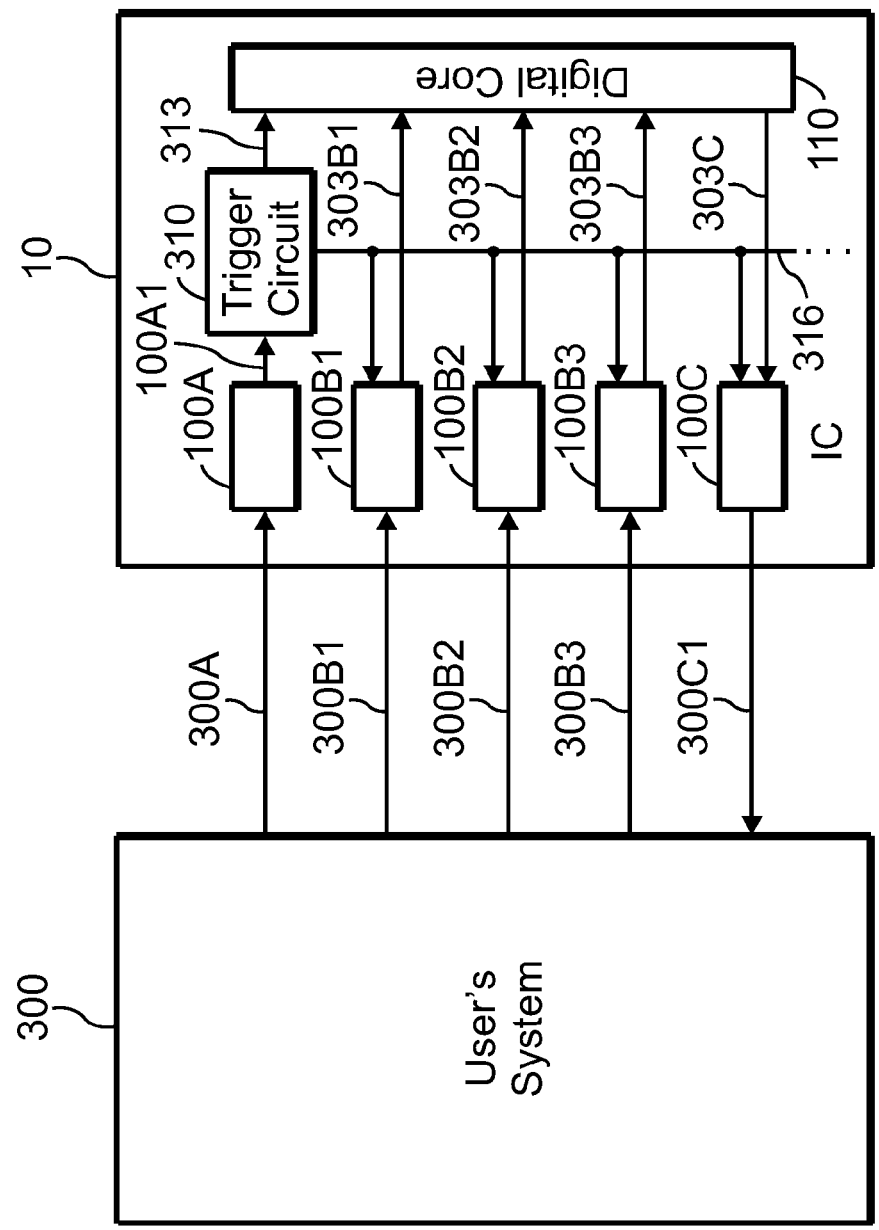
FIG. 18 shows a block diagram of an exemplary embodiment for asynchronous acquisition of information using MSIBs.

FIG. 18 shows a block diagram of an exemplary embodiment for asynchronous acquisition of information using MSIBs. In the exemplary embodiment shown, one trigger signal, provided via link 300A, drives MSIB 100A. Also, three input signals, provided via links 300B1-300B3, respectively, drive the respective inputs of MSIBs 100B1-100B3. Finally, through link 300C1, MSIB 100C provides an output signal to user's system 300.

Note that the number of links, trigger signals, input and output signals, and MSIBs shown in FIG. 18 are merely illustrative. As persons of ordinary skill in the art understand, other configurations, number of links, trigger signals, input and output signals, and MSIBs may be used in other embodiments.

For example, in some embodiments, more than one trigger signal may be used, along with corresponding numbers of MSIBs (e.g., two trigger signals with two sets of MSIBs). As another example, MSIBs may be used to obtain information or signals from user's system 300, but not provide information or signals to user's system 300. As yet another example, MSIBs may be used to provide information or signals to user's system 300, but not obtain information or signals from user's system 300.

In summary, a wide variety of configurations and functionality may be used in various embodiments. The choice of configuration and number of components, links, MSIBs, etc., depends on various factors, such as cost, complexity, desired performance, and the like, as persons of ordinary skill in the art understand.

The following description refers to the exemplary embodiment shown in FIG. 18. Other embodiments, which may have other specific implementations, such as different number of links, trigger signals, input and output signals, and/or MSIBs function in similar manners.

Referring to FIG. 18, MSIB 100A is configured to receive a trigger signal from user's system 300 via link 300A. (Note that more than one trigger signal may be used, as described above, with the general functionality described here.) In some embodiments, MSIB 100A may be configured to perform the functionality of a Schmitt trigger, a comparator, etc., as described above.

The trigger signal may have a variety of desired characteristics, such as a pulse. The trigger signal may signify a particular event, or set of events, in user's system 300. For example, in some embodiments, the trigger signal may signify a malfunction in user's system 300.

In other embodiments, the trigger signal may signify a signal or set of signals falling within or outside one or more thresholds, the occurrence of an event, or one or more conditions having been met or not having been met. For example, in some embodiments, the trigger signal may signify that a period of time has passed, and an event has not occurred. A wide variety of trigger conditions or configurations may be used in various implementations, as persons of ordinary skill in the art understand.

In response to receiving the trigger signal, MSIB 100A provides a signal to trigger circuit 310 via output 100A1. Trigger circuit 310 provides a trigger signal to MSIBs 100B1-100B3 and 100C. In response to the trigger signal from trigger circuit 310, MSIBs 100B1-100B3 acquire information from user's system 300 via links 300B1-300B3, and provide the information to digital core 110 of IC 10 via outputs 303B1-303B3.

MSIB 100C receives a signal at input 303C from digital core 110. In response to the trigger signal from trigger circuit 310, MSIB 100C generates a signal based on or derived from the input from digital core 110, and provides the signal to user's system 300 via link 300C1.

In some embodiments, MSIBs 100B1-100B3 may be configured or adapted to perform ADC functionality, as described above. Using the ADC functionality, digital core 110 may receive digital representations of analog information received from user's system 300. Digital core 110 may perform various functions, such as processing functions, based on the digital representations received from MSIBs 100B1-100B3.

In some embodiments, MSIB 100C may be configured or adapted to perform DAC functionality, as described above. Using the DAC functionality, MSIB 100C may provide to user's system 300 analog representations of digital information received from digital core 110. Digital core 110 may provide the digital information as a result of various processing functions, which may be in some situations based on information received from MSIBs 100B1-100B3. By using the ADC functionality of MSIBs 100B1-100B3 and the DAC functionality of MSIB 100C, IC 10 can perform control functions, such as plant control of an analog system or subsystem in user's system 300.

Trigger circuit 310 provides a signal to digital core 110 via link 313. The signal may be an interrupt signal, or another type of signal that initiates one or more activities in digital core 110. In response to the signal received via link 313, digital core 110 may receive or accept information from MSIBs 100B1-100B3. In addition, or instead, in response to the signal received via link 313, digital core 110 may provide information to MSIB 100C.

In some embodiments, trigger circuit 310 may constitute a trigger crossbar. In some embodiments, trigger circuit 310 may be omitted, depending on the functionality desired. For example, the output of MSIB 100A may directly drive the trigger inputs of MSIBs 100B1-100B3 and MSIB 100C, and digital core 110.

According to another aspect of the disclosure, parts of IC 10 may be placed in a low power (or sleep, suspend, or similar mode of operation). Placing parts of IC 10 in the low power state allows a reduction of the power consumption of IC 10, which might be advantageous in some applications, such as mobile or wireless applications. In the low power state, parts of IC 10 may have suspended functionality or low power functionality.

In response to a triggering event, for example, an input received from user's system 300 via link 300A, the parts of IC 10 that had been placed in low power may be awakened or enter normal operation. IC 10 may then receive output signals of user's system 300 via MSIBs 100B1-100B3. IC 10 may also provide input signal(s) to user's system 300 by using, for example, MSIB 100C, as described above.

Figure 19:
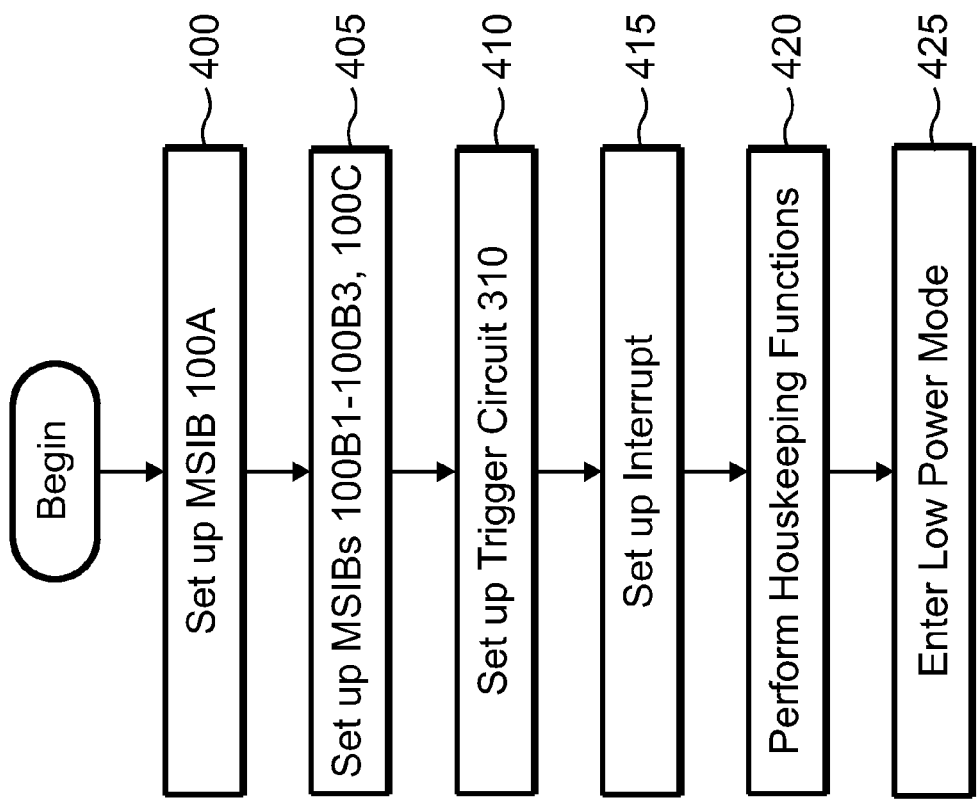

FIG. 19 shows a flow diagram for low power mode operation of an IC configured for asynchronous information acquisition. At 400, MSIB 100A is set up to receive a signal from user's system 300 via link 300A. For example, as noted above, MSIB 100A may be configured or adapted to provide comparator functionality or track track-in-suspend or track-and-hold functionality. The rest of the circuitry in MSIB 100A may be shut down, suspended, or placed in a low power mode. MSIB 100A tracks the signal received via link 300A in order to activate trigger circuit 310 when appropriate, as described above.

At 405, MSIBs 100B1-100B3 are set up to receive signals from user's system 300 via links 300B1-300B3, as described above. For example, as noted above, MSIBs 100B1-100B3 may be configured or adapted to provide ADC functionality and track or track-and-hold functionality. The rest of the circuitry in MSIBs 100B1-100B3 may be shut down, suspended, or placed in a low power mode.

In addition, MSIB 100C is set up to provide a signal to user's system 300 via link 300C1, as described above. For example, as noted above, MSIB 100C may be configured or adapted to provide DAC functionality. The rest of the circuitry in MSIB 100C may be shut down, suspended, or placed in a low power mode.

At 410, trigger circuit 310 is set up. For example, trigger types and levels may be configured or set up. Following the setup, trigger circuit 310 awaits receipt of a signal from MSIB 100A via output 100A1, as described above.

At 415, the interrupt for digital core 110 is set up. For example, the interrupt pointer and/or interrupt masks are set up, as persons of ordinary skill in the art understand. Digital core 110 may consequently be interrupted by trigger circuit 310, as described above.

At 420, housekeeping functions may optionally be performed. The nature of the housekeeping operations, if any, depends on the design and performance specifications for a given embodiment or implementation. Examples include saving registers, setting up pointers, saving states, communicating the imminent entry of the low power mode with other circuitry or systems (not shown), etc.

At 425, digital core 110, and IC 10 generally, enters the low power mode. Generally, the low power mode is maintained until a specified condition, such as an interrupt via output 313 of trigger circuit 310, is received. Depending on the details of a specific embodiment or implementation, other events or conditions may also cause interruption of the low power mode. Examples include other interrupts, such as during loss of power, and the like, as persons of ordinary skill in the art understand.

In the event of a trigger signal received by MSIB 100A from user's system 300, trigger circuit 310 causes the triggering of MSIBs 100B1-100B3, as described above. In response, MSIBs 100B1-100B3 hold the information present on or provided by links 300B1-300B3. In other words, MSIBs 100B1-100B3 "take a snapshot" of the signals or information provided by user's system 300. The information is subsequently available for processing by IC 10.

As noted, in response to a trigger event from user's system 300, trigger circuit 310 also interrupts digital core 110, and causes it to exit the low power mode. FIG. 20 shows a flow diagram of the related operations according to an exemplary embodiment.

At 500, IC 10 exits low power mode. Various circuits or blocks of circuitry may leave the low power mode and resume normal operation. Examples include MSIBs 100A-100C, various circuits in digital core 110, etc. Digital core 110 may also perform various housekeeping tasks, which may correspond to the housekeeping tasks performed before entering the low power mode, described above.

At 505, the state of IC 10 may optionally be restored. The details of the operations, if any, performed depend on the design and performance specifications of a given embodiment or implementation.

At 510, information is received from user's system 300 via MSIBs 100B1-100B3. The details of the operation are described above in connection with FIGS. 17-18. For example, MSIBs 100B1-100B3, which had been in the hold mode, may perform analog-to-digital conversion on the held information, and provide the resulting digital information to digital core 110.

At 515, various processing tasks may be optionally performed. For example, in some embodiments, the digital information received from MSIBs 100B1-100B3 may be further processed. Examples of such processing include filtering, statistical analysis, control functions, and the like. The specific tasks, if any, depend on the design and performance specifications for a given embodiment or implementation, as persons of ordinary skill in the art understand.

At 520, information may be optionally provided to user's system 300. Specifically, digital core 110 may provide the information to user's system 300 via MSIB 100C, as described above. In some embodiments, the information provided by MSIB 100C may be the results of, or may be derived from the results of, the processing performed at 515. In this manner, a feedback loop may be formed around user's system 300 and IC 10, allowing IC 10 to control various functions of user's system 300.

Referring to FIGS. 19-20, note that the order of performing the operations corresponds to the exemplary embodiments shown and described. In other embodiments, the order of performing the operations may be different. For example, referring to FIG. 19, the operations at 405, 410, and 415 may be performed in a different order (e.g., 410, 405, 415). The order of performing the operations may depend on the design and performance specifications of a given embodiment or implementation, available technology and processing capabilities, the architecture of digital core 110, etc., as persons of ordinary skill in the art understand.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An integrated circuit (IC), comprising:
    a plurality of pads adapted to communicate signals with a circuit external to the IC;
    a first mixed signal interface block coupled to a first pad in the plurality of pads, the first mixed signal interface block adapted to receive a first trigger signal from the circuit external to the IC and to provide a second trigger signal; and
    a second mixed signal interface block coupled to a second pad in the plurality of pads, the second mixed signal interface block adapted to receive and track a first input signal from the circuit external to the IC in a first mode of operation of the IC, and to generate, in response to the second trigger signal, a first output signal based on the first input signal and to provide the first output signal to a digital core of the IC in a second mode of operation of the IC,
    wherein a power consumption of the IC is lower in the first mode of operation than in the second mode of operation.

2. The IC according to claim 1, wherein the first mode of operation of the IC comprises a low power mode of operation.

3. The IC according to claim 2, wherein the second mode of operation of the IC comprises a normal mode of operation.

4. The IC according to claim 1, wherein in the first mode of operation of the IC, the second mixed signal interface block is further adapted to track the first input signal.

5. The IC according to claim 4, wherein in the second mode of operation of the IC, the second mixed signal interface block is further adapted to generate a first digital signal by analog-to-digital conversion of the first input signal and to provide the first digital signal to the digital core of the IC.

6. The IC according to claim 1, further comprising a third mixed signal interface block coupled to a third pad in the plurality of pads, the third mixed signal interface block adapted to receive and track a second input signal from the circuit external to the IC in the first mode of operation of the IC, and to generate, in response to the second trigger signal, a second output signal based on the second input signal and to provide the second output signal to the digital core of the IC in the second mode of operation of the IC.

7. The IC according to claim 6, wherein in the first mode of operation of the IC, the third mixed signal interface block is further adapted to track the second input signal.

8. The IC according to claim 7, wherein in the second mode of operation of the IC, the third mixed signal interface block is further adapted to generate a second digital signal by analog-to-digital conversion of the second input signal and to provide the second digital signal to the digital core of the IC.

9. The IC according to claim 6, further comprising a fourth mixed signal interface block coupled to a fourth pad in the plurality of pads, the third mixed signal interface block adapted to generate, in response to the second trigger signal, a third output signal based on a digital signal from the digital core of the IC, and to provide the third output signal to the circuit external to the IC in the second mode of operation of the IC.

10. The IC according to claim 9, wherein the fourth mixed signal interface block is further adapted to generate the third output signal by digital-to-analog conversion of the digital signal from the digital core of the IC.

11. The IC according to claim 1, wherein the first mixed signal interface block provides the second trigger signal asynchronously with respect to a clock signal of the digital core of the IC.

12. The IC according to claim 11, wherein the second mixed signal interface block generates the first output signal asynchronously with respect to the clock signal of the digital core of the IC.

13. A mixed signal integrated circuit (IC), comprising:
- a digital core comprising microcontroller (MCU) circuitry;
- a plurality of pads adapted to communicate signals with a circuit external to the IC;
- a first mixed signal interface block coupled to a first pad in the plurality of pads, the first mixed signal interface block adapted to receive a first trigger signal from the circuit external to the IC and to provide a second trigger signal;
- a trigger circuit adapted to, in response to the second trigger signal, generate a third trigger signal and to generate an interrupt signal and provide the interrupt trigger signal to the digital core of the mixed signal IC; and
- a second mixed signal interface block coupled to a second pad in the plurality of pads, the second mixed signal interface block adapted to receive and track a first analog signal from the circuit external to the mixed signal IC in a first mode of operation of the mixed signal IC, and in response to the third trigger signal, convert the first analog signal to a first digital signal and to provide the first digital signal to the digital core of the mixed signal IC in a second mode of operation of the mixed signal IC.

14. The mixed signal IC according to claim 13, wherein the first mode of operation of the mixed signal IC comprises a low power mode of operation, and the second mode of operation of the mixed signal IC comprises a normal mode of operation.

15. The mixed signal IC according to claim 14, wherein the first mixed signal interface block is further adapted to provide the second trigger signal during the first mode of operation, and wherein the trigger circuit is further adapted to provide the third trigger signal and the interrupt signal during the first mode of operation of the mixed signal IC.

16. The mixed signal IC according to claim 15, wherein the digital core of the mixed signal IC is adapted to exit the first mode of operation and enter the second mode of operation in response to the interrupt signal.

17. The mixed signal IC according to claim 15, wherein the second and third trigger signals and the interrupt signal are generated asynchronously with respect to a clock signal of the mixed signal IC.

18. A method of processing signals using a mixed signal integrated circuit (IC), the method comprising:
- operating the mixed signal IC in a first mode of operation;
- tracking in a first mixed signal interface block, coupled to a first pad of the mixed signal IC, a first input signal from the circuitry external to the mixed signal IC in the first mode of operation;
- using a second mixed signal interface block coupled to a second pad of the mixed signal IC to receive a first trigger signal from the circuitry external to the mixed signal IC and to generate a second trigger signal;
- operating the mixed signal IC in a second mode of operation in response to the second trigger signal, wherein a power consumption of the mixed signal IC is lower in the first mode of operation than in the second mode of operation; and
- converting, in the second mode of operation, the first input signal to a digital signal by performing analog-to-digital conversion in the first mixed signal interface block.

19. The method according to claim 18, wherein operating the mixed signal IC in the first mode of operation further comprises operating circuitry in the mixed signal IC, including a digital core of the mixed signal IC, in a lower power mode of operation.

20. The method according to claim 19, wherein operating the mixed signal IC in the second mode of operation in response to the second trigger signal, further comprises operating circuitry in the mixed signal IC, including the digital core of the mixed signal IC, in a normal mode of operation.

\* \* \* \* \*